(12) United States Patent
Yu et al.

(10) Patent No.: US 11,532,596 B2
(45) Date of Patent: Dec. 20, 2022

(54) PACKAGE STRUCTURE AND METHOD OF FORMING THE SAME

(71) Applicant: Taiwan Semiconductor Manufacturing Company, Ltd., Hsinchu (TW)

(72) Inventors: Tsung-Yuan Yu, Taipei (TW); Hung-Yi Kuo, Taipei (TW); Cheng-Chieh Hsieh, Tainan (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 29 days.

(21) Appl. No.: 17/192,903

(22) Filed: Mar. 5, 2021

(65) Prior Publication Data
US 2022/0285317 A1 Sep. 8, 2022

(51) Int. Cl.
*H01L 25/065* (2006.01)
*H01L 23/31* (2006.01)
*H01L 21/56* (2006.01)
*H01L 23/00* (2006.01)

(52) U.S. Cl.
CPC ........ *H01L 25/0655* (2013.01); *H01L 21/561* (2013.01); *H01L 23/3128* (2013.01); *H01L 24/19* (2013.01); *H01L 24/24* (2013.01); *H01L 2224/24225* (2013.01)

(58) Field of Classification Search
CPC .............. H01L 25/0655; H01L 21/561; H01L 23/3128; H01L 24/19; H01L 24/24; H01L 2224/24225
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |

(Continued)

*Primary Examiner* — Fernando L Toledo
*Assistant Examiner* — Neil R Prasad
(74) *Attorney, Agent, or Firm* — JCIPRNET

(57) ABSTRACT

A package structure and method of forming the same are provided. The package structure includes a semiconductor unit, a package component and an underfill layer. The semiconductor structure unit includes a first semiconductor structure and a second semiconductor structure disposed as side by side, and an isolation region laterally between the first semiconductor structure and the second semiconductor structure. The isolation region vertically extends from a top surface to a bottom surface of the semiconductor structure unit. The semiconductor structure unit is disposed on and electrically connected to the package component. The underfill layer is disposed to fill a space between the semiconductor structure unit and the package component.

20 Claims, 26 Drawing Sheets

(56) References Cited

U.S. PATENT DOCUMENTS

| | | |
|---|---|---|
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 * | 8/2017 | Su et al. |
| 2013/0147054 A1 * | 6/2013 | Lin ............... H01L 23/3114 257/774 |
| 2021/0151407 A1 * | 5/2021 | Liu ............... H01L 23/49822 |
| 2021/0159188 A1 * | 5/2021 | Fang ............. H01L 23/5389 |
| 2021/0225665 A1 * | 7/2021 | Sinha ........... H01L 23/3128 |

\* cited by examiner

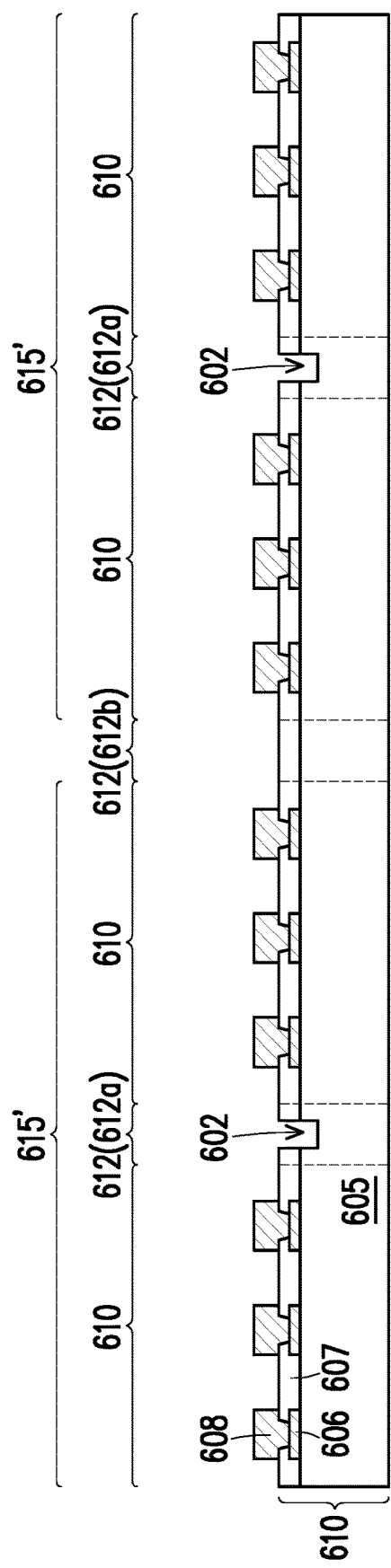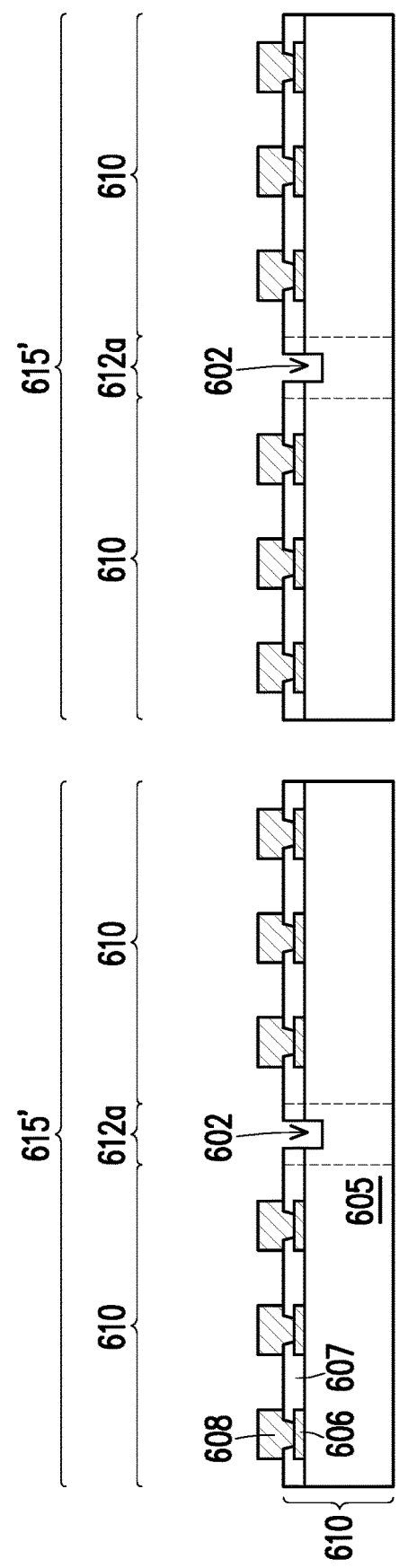
FIG. 9A
FIG. 9B

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1D is a cross-sectional view taken along line I-I' of FIG. 2.

FIG. 9A to FIG. 9C are schematic cross-sectional views illustrating a method of forming a package structure according to some embodiments of the disclosure.

DETAILED DESCRIPTION

Figure 1A:
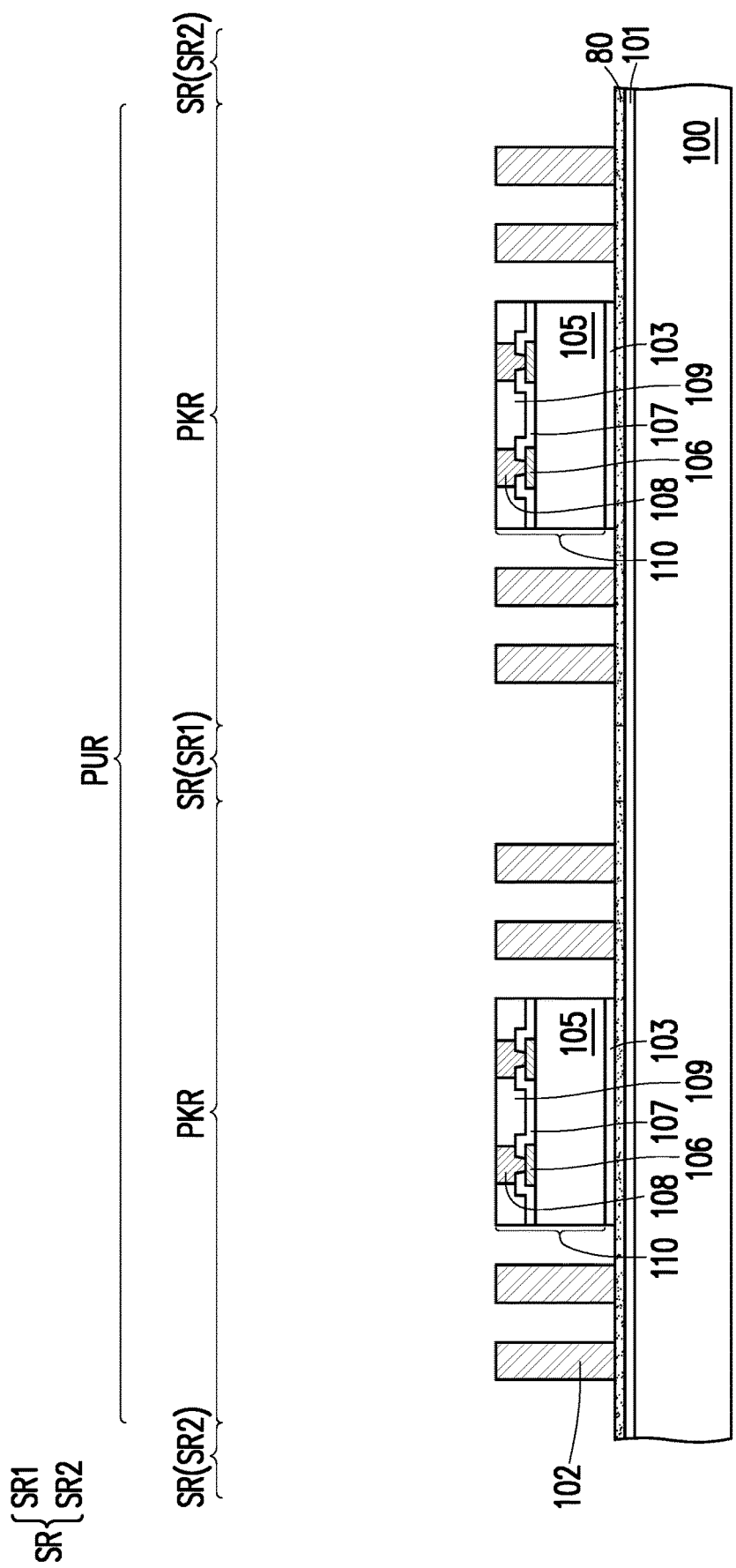
FIG. 1A to FIG. 1G are schematic cross-sectional views illustrating a method of forming a package structure according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating a method of forming a package structure according to some embodiments of the disclosure.

Referring to FIG. 1A, a carrier 100 is provided. The carrier 100 may be a glass carrier, a ceramic carrier, or the like. A de-bonding layer 101 is formed on the carrier 100 by, for example, a spin coating method. In some embodiments, the de-bonding layer 101 may be formed of an adhesive such as an Ultra-Violet (UV) glue, a Light-to-Heat Conversion (LTHC) glue, or the like, or other types of adhesives. The de-bonding layer 101 is decomposable under the heat of light to thereby release the carrier 100 from the overlying structures that will be formed in subsequent steps.

The carrier 100 is configured to provide mechanical support for package structures to be formed thereon. In some embodiments, the carrier 100 may include a plurality of regions corresponding to a plurality of package regions PKR, scribe regions SR and package unit regions PUR of the package structures to be formed thereon. The scribe regions SR are between and separate the package regions PKR from each other. Each of package unit regions PUR is constituted by a plurality of (e.g., at least two) package regions PKR and the scribe regions SR between the package regions PKR. The number of the package regions PKR included in each package unit region PUR is not limited in the disclosure, and different package unit regions PUR may include different number of package regions PKR.

In some embodiments, a dielectric layer 80 may be formed on the de-bonding layer 101 over the carrier 100. The dielectric layer 80 may be a polymer layer including polymer materials, but the disclosure is not limited thereto. Alternatively, the dielectric layer 80 may include inorganic dielectric materials. For example, the dielectric layer 80 may include polybenzoxazole (PBO), polyimide (PI), benzocyclobutene (BCB), ajinomoto buildup film (ABF), solder resist film (SR), or the like, a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or combinations thereof. The dielectric layer 80 may be formed by a suitable fabrication technique such as spin-coating, lamination, deposition such as chemical vapor deposition (CVD), or the like. It is noted that, the dielectric layer 80 is optionally formed and may be omitted in some embodiments.

Still referring to FIG. 1A, a plurality of conductive vias 102 are formed over the carrier 100 within the package regions PKR. The conductive via 102 may include copper, titanium, nickel, solder, alloys thereof, or the like or combinations thereof. In some embodiments, the conductive vias 102 each include a seed layer and a conductive post formed thereon (not individually shown). The seed layer may be a metal seed layer such as a copper seed layer. In some embodiments, the seed layer includes a first metal layer such as a titanium layer and a second metal layer such as a copper layer over the first metal layer. The conductive post may include copper or other suitable metallic materials.

In some embodiments, the formation of the conductive vias 102 may include the following processes. A seed material layer is formed on the dielectric layer 80 by sputtering, for example. A patterned mask layer is then formed on the seed material layer for defining the conductive vias 102. The patterned mask layer may include photoresist and has a plurality of openings that exposes portions of the seed material layer at the intended locations for the conductive vias 102. Thereafter, conductive posts are formed on the seed material layer within the openings of the patterned mask layer, by an electroplating process, for example. The patterned mask layer is removed by an ashing process or a stripping process. Portions of the seed material layer previously covered by the patterned mask layer are then removed by an etching process using the conductive posts as an etching mask. As such, the conductive posts and the seed layer underlying thereof constitute the conductive vias 102. It is noted that, the conductive vias 102 are optionally formed and may be omitted in some embodiments. Further, the number of the conductive vias 102 shown in the figures is merely for illustration, and the disclosure is not limited thereto.

Still referring to FIG. 1A, a plurality of dies 110 are mounted over the carrier 100 by pick and place processes, for example. In some embodiments, the dies 110 are attached to the carrier 100 through adhesive layers 103, such as die attach film (DAF), silver paste, or the like. In some embodiments, the dies 110 may be respectively disposed within the package regions PKR and are laterally surrounded by or between the conductive vias 102. Although one die 110 is illustrated to be disposed in each package region PKR as an example, the disclosure is not limited thereto. In some embodiments, more than one die 110 may be mounted as side by side in each package region PKR, and the number of die(s) 110 mounted in different package regions PKR may be the same or different.

The dies 110 may be singulated from one or more semiconductor wafer, for example. In some embodiments, the dies 110 may be device dies each including various active devices, passive devices, or combinations thereof. For example, the dies 110 may respectively be an application-specific integrated circuit (ASIC) chip, an System on Chip (SoC), an analog chip, a sensor chip, a wireless and radio frequency chip, a voltage regulator chip, a logic die such as a Central Processing Unit (CPU) die, a Micro Control Unit (MCU) die, a BaseBand (BB) die, an Application processor (AP) die, or a memory chip such as a Dynamic Random Access Memory (DRAM) die, a Static Random Access Memory (SRAM) die, or a high bandwidth memory (HBM) chip, or the like, other suitable types of die, for example.

In some embodiments, the die 110 includes a substrate 105, a plurality of pads 106, a plurality of connectors 108, and passivation layers 107 and 109. In some embodiments, the substrate 105 is made of silicon or other semiconductor materials. Alternatively or additionally, the substrate 105 includes other elementary semiconductor materials such as germanium, gallium arsenic, or other suitable semiconductor materials. In some embodiments, the substrate 105 may further includes other features such as various doped regions, a buried layer, and/or an epitaxy layer. Moreover, in some embodiments, the substrate 105 is made of an alloy semiconductor such as silicon germanium, silicon germanium carbide, gallium arsenic phosphide, or gallium indium phosphide. Furthermore, the substrate 105 may be a semiconductor on insulator such as silicon on insulator (SOI) or silicon on sapphire.

In some embodiments, a plurality of devices (not shown) are formed in and/or on the substrate 105. The devices may be active devices, passive devices, or combinations thereof. For example, the devices may include transistors, capacitors, resistors, diodes, photodiodes, fuse devices, or the like, or combinations thereof. In some embodiments, an interconnection structure (not shown) including a dielectric structure and interconnect wirings are formed over the devices on the substrate 105. The interconnect wirings are embedded in the dielectric structure and electrically connected to the devices to form a functional circuit. In some embodiments, the dielectric structure includes inter-layer dielectric layers (ILDs) and inter-metal dielectric layers (IMDs). The interconnect wirings may include multi-layers of conductive lines, conductive vias, and conductive contacts. The conductive contacts may be formed in the ILDs to electrically connect the conductive lines to the devices; the conductive vias may be formed in the IMDs to electrically connect the conductive lines in different tiers. The interconnect wirings may include metal, metal alloy or a combination thereof, such as tungsten (W), copper (Cu), copper alloys, aluminum (Al), aluminum alloys, or combinations thereof.

The pads 106 may be or electrically connected to a top conductive feature of the interconnection structure, and further electrically connected to the devices formed on the substrate 105 through the interconnection structure. The material of the pads 106 may include metal or metal alloy, such as aluminum, copper, nickel, or alloys thereof.

The passivation layer 107 is formed over the substrate 105 and covers portions of the pads 106. The other portions of the pads 106 are exposed by the passivation layer 107 for external connection. The connectors 108 are formed on and electrically connected to the pads 106 not covered by the passivation layer 107. The connectors 108 may include solder bumps, gold bumps, copper bumps, copper posts, copper pillars, or the like. The passivation layer 109 may be formed on the passivation layer 107 and laterally covering sidewalls of the connectors 108. The passivation layers 107 and 109 may each include an insulating material such as silicon oxide, silicon nitride, polymer, or a combination thereof. The polymer may include polybenzoxazole (PBO), polyimide (PI), benzocyclobutene (BCB), the like, or combinations thereof.

Figure 1B:
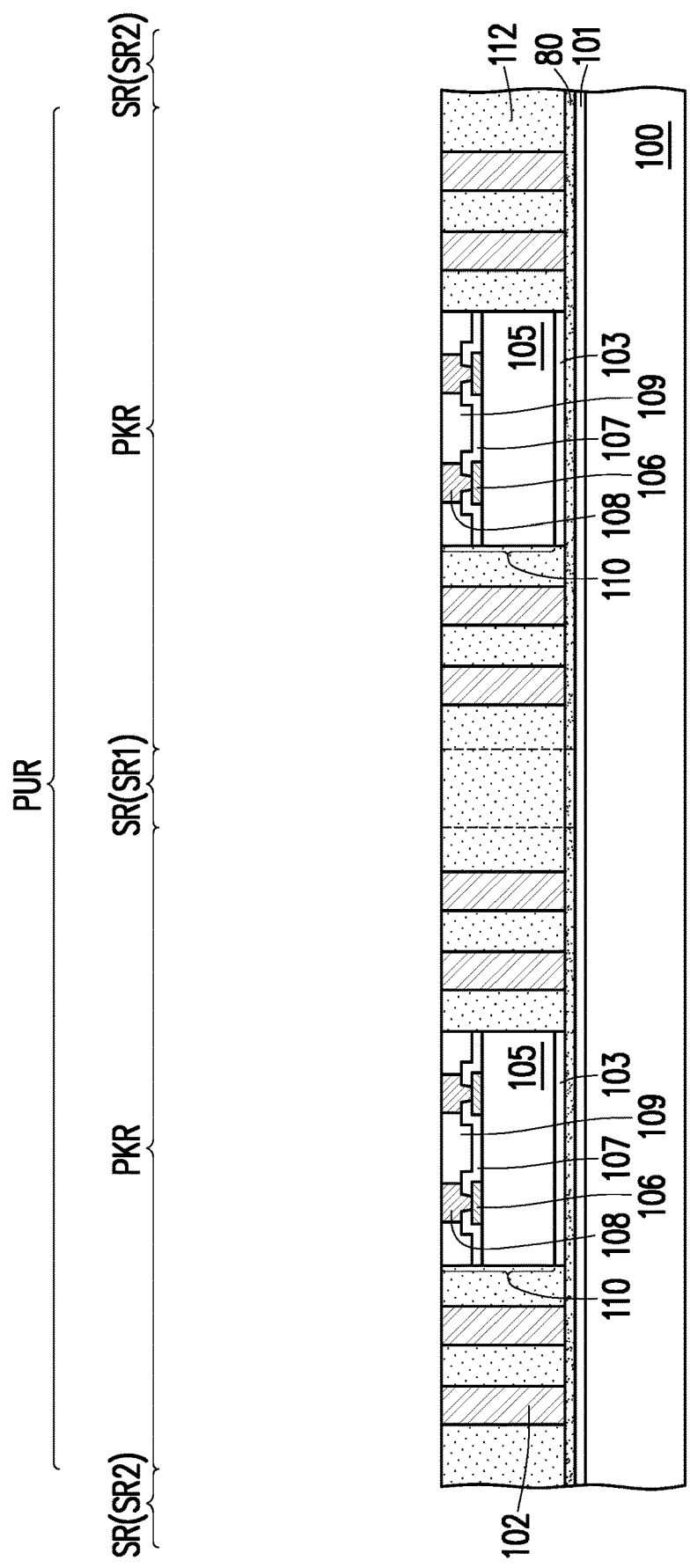

Referring to FIG. 1B, an encapsulant 112 is formed over the carrier 100 to encapsulate the dies 110 and the conductive vias 102. In some embodiments, the encapsulant 112 may include a molding compound, a molding underfill, a resin such as epoxy, a combination thereof, or the like. In some other embodiments, the encapsulant 112 includes a photo-sensitive material such as polybenzoxazole (PBO), polyimide (PI), benzocyclobutene (BCB), a combination thereof, or the like. In alternative embodiments, the encapsulant 112 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 112 may include a molding compound which is a composite material. For example, the encapsulant 112 may include a base material (such as polymer) and a plurality of fillers distributed in the base material. The fillers may include a single element, a compound such as nitride, oxide, or a combination thereof. The fillers may include silicon oxide, aluminum oxide, boron nitride, alumina, silica, or the like, or combinations thereof, for example. In some embodiments, the fillers may be spherical fillers, but the disclosure is not limited thereto. The cross-sectional shape of the filler may be circle, oval, or any other suitable shape. In some embodiments, the encapsulant 112 is formed by forming an encapsulant material layer over the carrier 100 to encapsulate top surfaces and sidewalls of the die 110 and the conductive vias 102, through a suitable fabrication technique such as molding, spin-coating, lamination, deposition, or similar processes. Thereafter, a planarization process (e.g., CMP) is performed to remove excess portion of the encapsulant material layer over the top surfaces of the die 110 and the conductive vias 102, such that the top surfaces of the connectors 108 of the die 110 and the conductive vias 102 are exposed. In some embodiments, after the planarization process is performed, the top surface of the encapsulant 112, the top surfaces of the conductive vias 102 and the top surfaces of the dies 110 are substantially coplanar or level with each other.

In some embodiments, the encapsulant 112 is continuously extending in the plurality of package regions PKR and the scribe regions SR, and laterally surrounding the dies 110 and conductive vias 102. The conductive vias 102 penetrate through the encapsulant 112. In some embodiments, the conductive vias 102 may also be referred to as through integrated fan-out vias (TIVs).

Figure 1C:
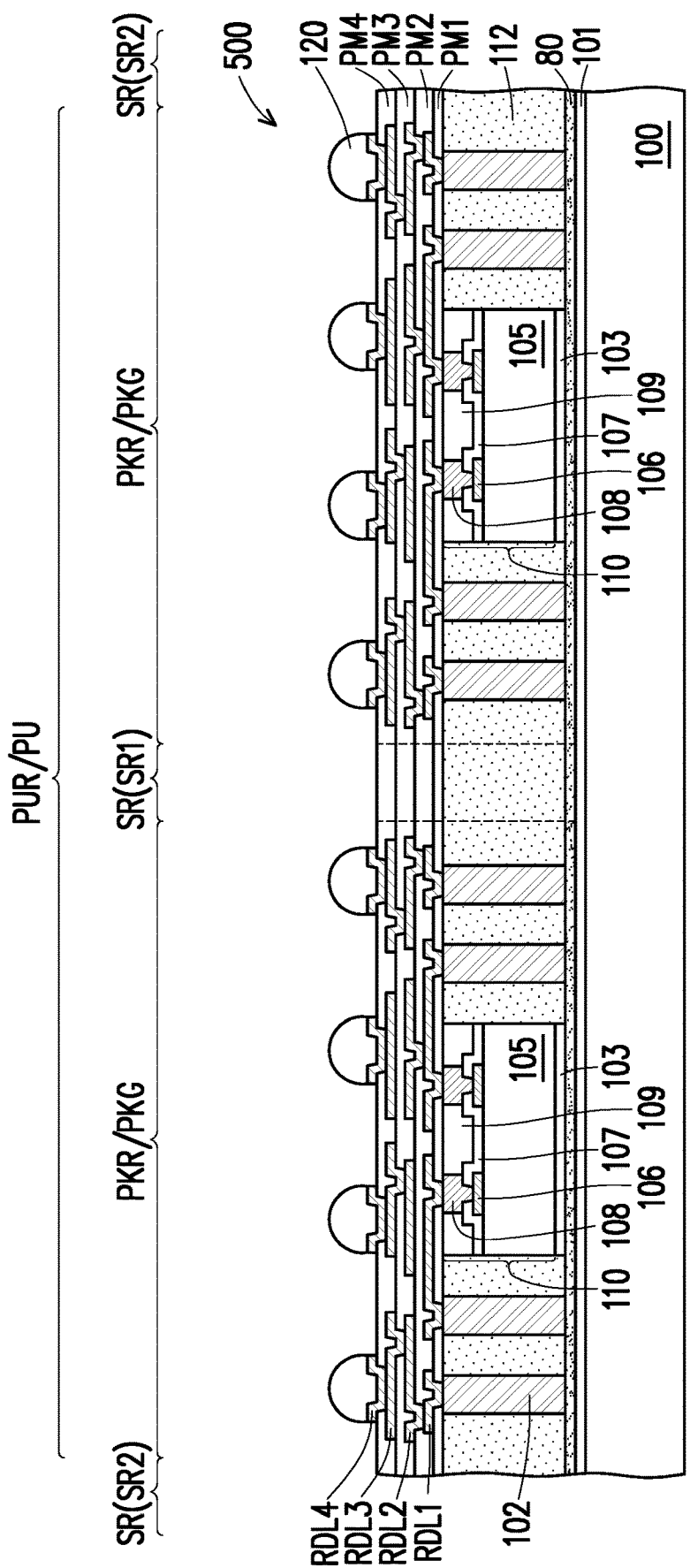

Referring to FIG. 1C, a redistribution layer (RDL) structure 115 is formed over the encapsulant 112 and the dies 110. The RDL structure 115 may include a polymer structure (e.g., including multiple polymer layers) and redistribution layers. For example, the RDL structure 115 includes a plurality of polymer layers PM1, PM2, PM3, PM4 and a plurality of redistribution layers RDL1, RDL2, RDL3, RDL4 stacked alternately. The number of the polymer layers or the redistribution layers shown in the figures is merely for illustration, and the disclosure is not limited thereto. The polymer layers are continuously extending in the package regions PKR and the scribe regions SR, while the redistribution layers are disposed in the respective package regions PKG and electrically connected to the die(s) 110 included in the respective package regions PKG. The redistribution layers in different package regions PKR are isolated from each other by the scribe region SR therebetween.

In some embodiments, within the respective package region PKR, the redistribution layer RDL1 penetrates through the polymer layer PM1 to be physically and electrically connected to the connectors 108 of the die 110 and the conductive vias 102. The redistribution layer RDL2 penetrates through the polymer layer PM2 to be electrically connected to the redistribution layer RDL1. The redistribution layer RDL3 penetrates through the polymer layer PM3 to be electrically connected to the redistribution layer RDL2. The redistribution layer RDL4 penetrates through the polymer layer PM4 to be electrically connected to the redistribution layer RDL3.

In some embodiments, the polymer layers PM1, PM2, PM3, PM4 respectively includes a polymer material, which may include photo-sensitive material such as polybenzoxazole (PBO), polyimide (PI), benzocyclobutene (BCB), combinations thereof or the like. The forming methods of the polymer layers PM1, PM2, PM3, PM4 include suitable fabrication techniques such as spin coating, chemical vapor deposition (CVD), plasma-enhanced chemical vapor deposition (PECVD), lamination or the like. In some embodiments, the redistribution layers RDL1, RDL2, RDL3, RDL4 respectively include conductive materials. The conductive material includes metal such as copper, nickel, titanium, a combination thereof or the like, and may be formed by PVD, plating such as an electroplating process, or combinations thereof. In some embodiments, the redistribution layers RDL1, RDL2, RDL3, RDL4 respectively include a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may include copper or other suitable metallic materials.

In some embodiments, the redistribution layer RDL4 may be the topmost redistribution layer of the RDL structure 115, and may be or include under-ball metallurgy (UBM) layer for ball mounting.

Still referring to FIG. 1C, a plurality of connectors 120 are formed over and electrically connected to the redistribution layer RDL4 (e.g., UBM) of the RDL structure 115. In some embodiments, the connectors 120 may also be referred to as conductive terminals. In some embodiments, the connectors 120 may be or include ball grid array (BGA) connectors, solder balls, controlled collapse chip connection (C4) bumps, or a combination thereof. In some embodiments, the material of the connector 120 includes copper, aluminum, lead-free alloys (e.g., gold, tin, silver, aluminum, or copper alloys) or lead alloys (e.g., lead-tin alloys), or combinations thereof. The connector 120 may be formed by a suitable process such as evaporation, plating, ball dropping, screen printing and reflow process, a ball mounting process or a C4 process.

As such, a plurality of package structures PKG are formed within the package regions PKR, and a structure 500 including a plurality of package structures PKG are thus formed over the carrier 100. The package structures PKG are spaced apart from each other by scribe regions SR. In some embodiments, the structure 500 may also be referred to as an initial structure for the subsequent processes, or referred to as an intermediate structure formed in an intermediate stage of forming a final package structure.

Figure 1D:
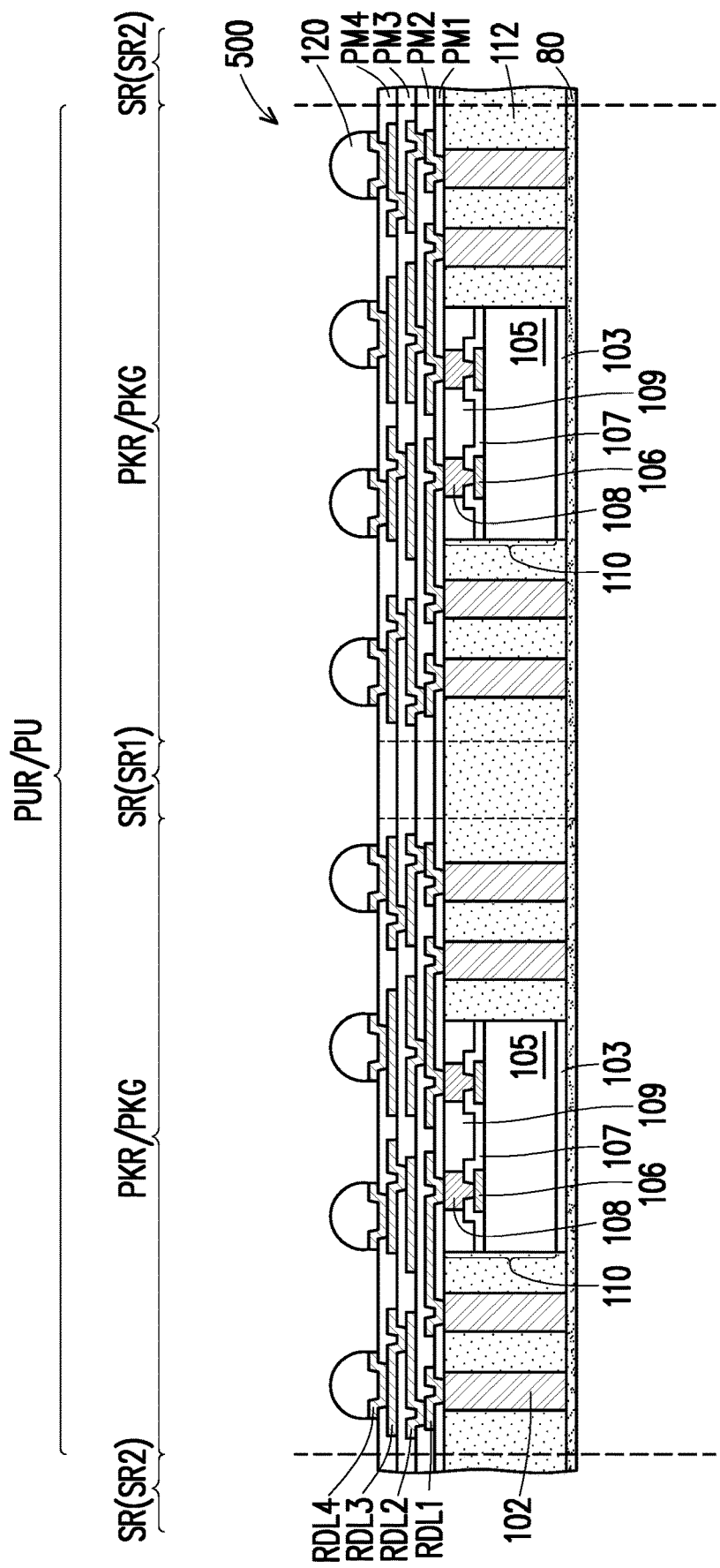

Referring to FIG. 1C and FIG. 1D, in some embodiments, the de-bonding layer 101 is decomposed under the heat of light, and the carrier 100 is then released from overlying structure 500. In some embodiments, the structure 500 may then be disposed on a frame tape (not shown), for a subsequently performed singulation process.

Figure 2:
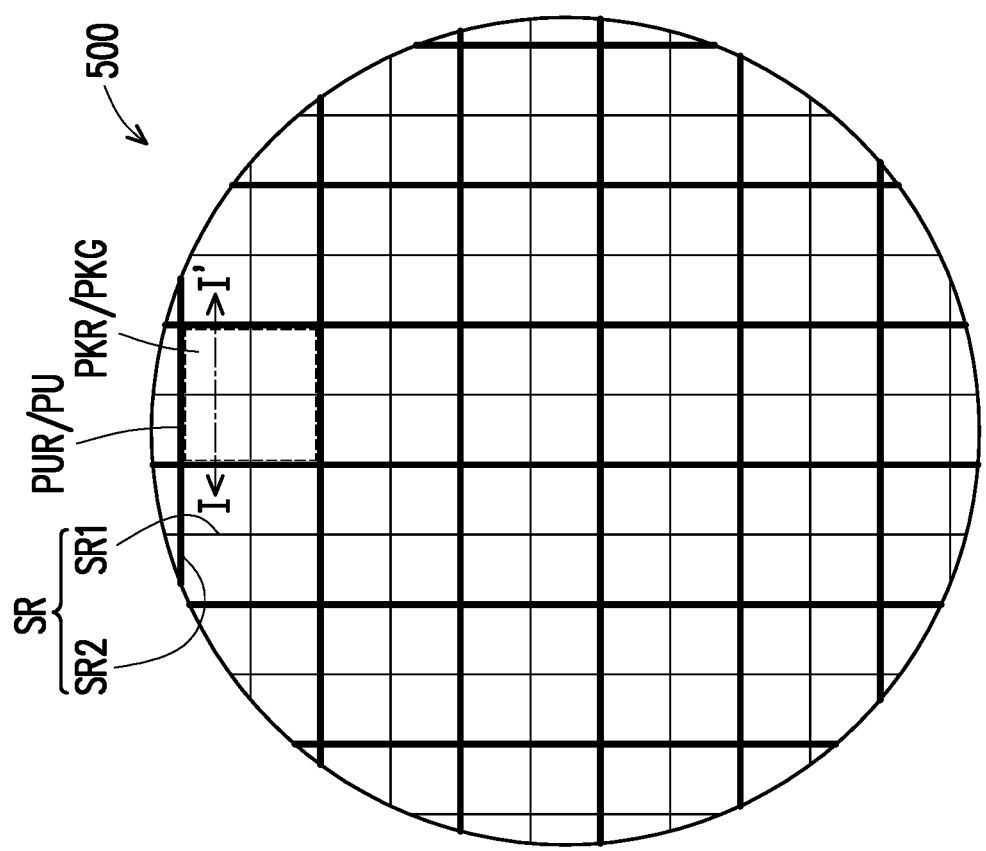
FIG. 2 illustrates a top view of FIG. 1D.

FIG. 2 illustrates a top view of the structure 500 before the singulation process is performed, and FIG. 1D is a cross-sectional view taken along line I-I' of FIG. 2. It is noted that, for the sake of brevity, the scribe regions SR are shown as lines in top view, and may also be referred to as scribe lines.

Referring to FIG. 1D and FIG. 2, the structure 500 includes a plurality of package structures PKG and scribe regions SR. In some embodiments, at least two of the package structures PKG and scribe regions SR disposed within the respective package unit region PUR constitute a package unit PU. The package unit PU may also be referred to as a semiconductor structure unit, and the package structures PKG may also be referred to as semiconductor structures included in the semiconductor structure unit. In some embodiments, the scribe regions SR include scribe regions SR1 disposed within the package units PU and scribe regions SR2 (shown as bold line in FIG. 2) disposed between the package units PU and/or along the peripheries of the package units PU.

In other words, the structure 500 includes a plurality of package units PU that are formed in the package unit regions PUR, and each of the package units PU may include a plurality of package structures PKG disposed in the package regions PKR and scribe regions SR1 between the package structures PKG. In some embodiments, the package unit PU may include at least two package structures PKG, such as four package structure PKG which may be arranged in a 2×2 array, as shown in FIG. 2. However, the disclosure is not limited thereto. The number and configuration of the package structures PKG included in each package unit PU may be adjusted based on product design and requirement. For example, in some other embodiments, the package structures PKG of the package unit PU may be arranged in a 2×1 array, 3×1 array, 3×2 array, 3×3 array, and so on. In some embodiments, the package units PU included in the structure 500 may be disposed to have the same types of configurations (i.e., 2×2 arrays), but the disclosure is not limited thereto. In some other embodiments, the package units PU included in the structure 500 may be disposed to have different types of configurations. For example, some of the package units PU have package structures arranged in a 2×2 array; while some other of the package units PU have package structure arranged in other types of configuration, such as 2×1 array, 2×3 array, or other suitable configurations.

Figure 1E:
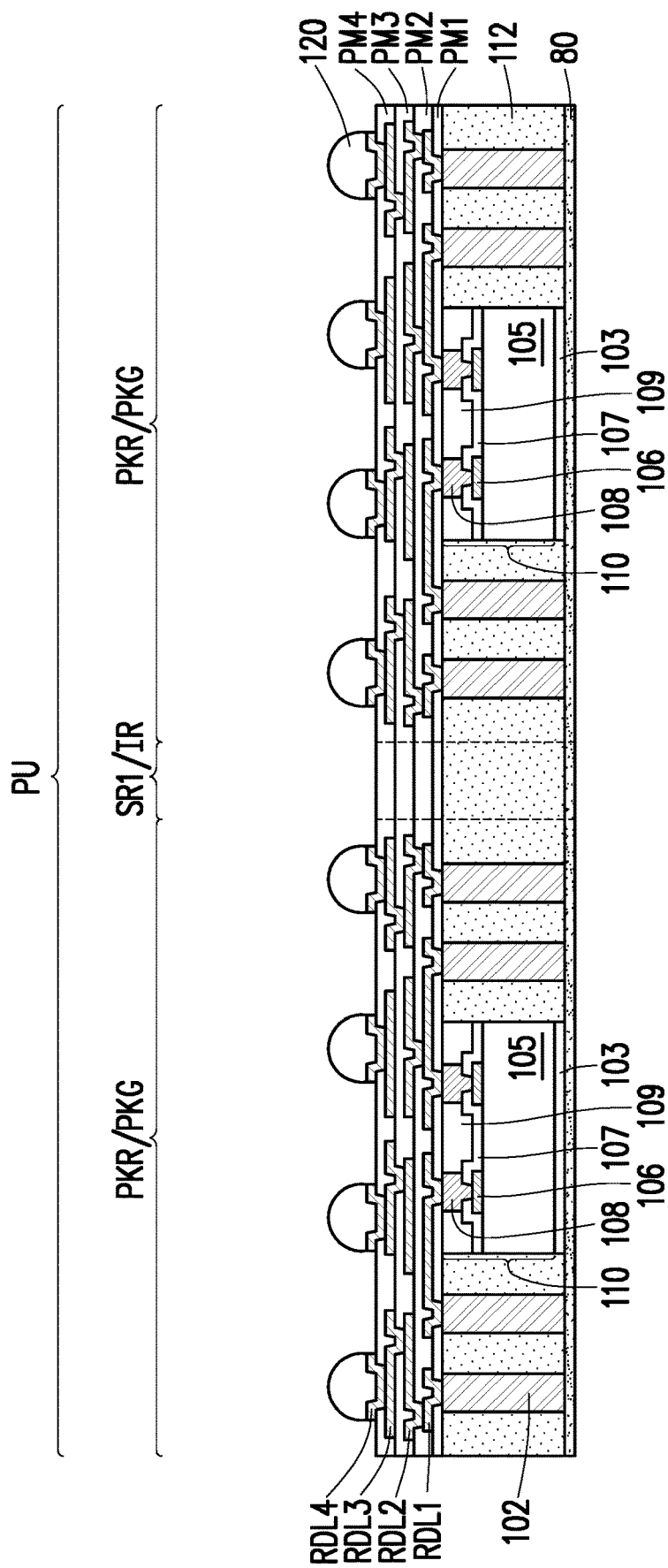

Referring to FIG. 1D, FIG. 1E and FIG. 2, in some embodiments, the singulation process is performed along the scribe regions SR2 between the package unit regions PUR and along the peripheries of the package unit regions PUR, so as to singulate the package units PU. The bold dotted line in FIG. 1D schematically illustrate cutting path along the scribe regions SR2. The singulation process cut through the scribe regions SR2, so as to separate the package units PU from each other. The singulation process may include a mechanical saw process, laser dicing process, or the like or combinations thereof.

Referring to FIG. 1E, one of the singulated package units PU is illustrated. In some embodiments, the scribe regions SR1 between the package structures PKG within the package unit PU are not subjected to the singulation process, and are thus remained in the singulated package unit PU. In some embodiments, the scribe regions SR1 may also be referred to as isolation regions IR that physically and electrically separating the package structures PKR included in the package unit PU.

Figure 4B:
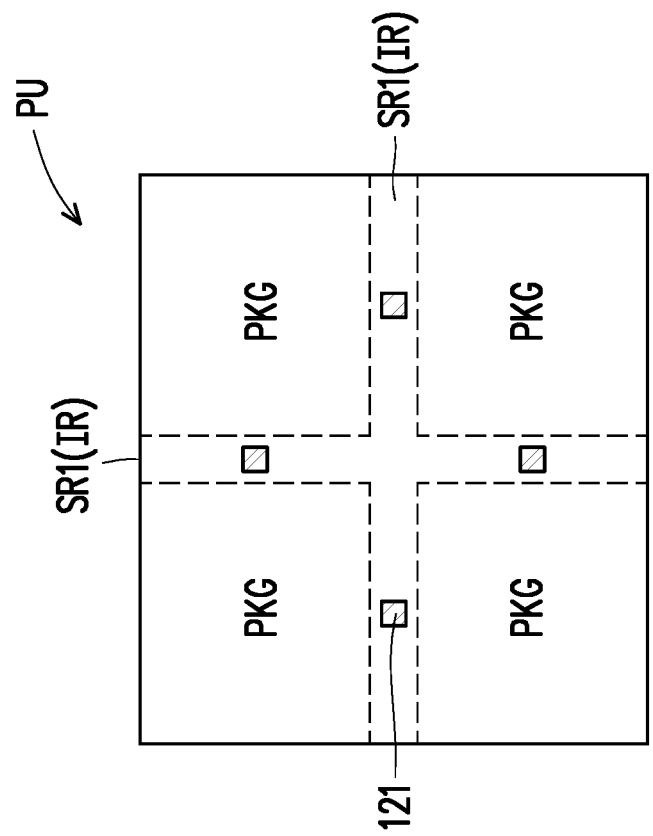
FIG. 4A and FIG. 4B illustrates top views of package units according to some embodiments of the disclosure.
Figure 4A:
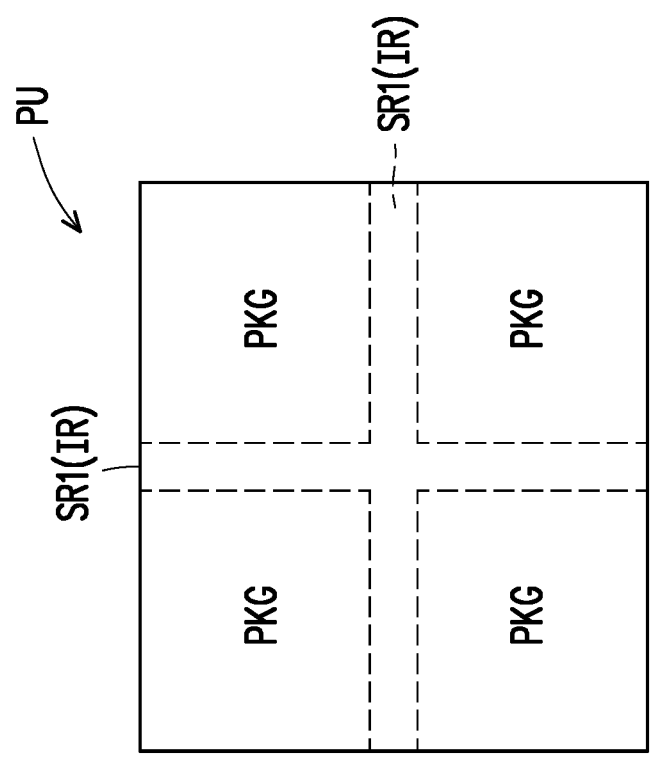

FIG. 4A illustrates a top view of a package unit PU shown in FIG. 1E, which is singulated from the structure 500.

Referring to FIG. 1E and FIG. 4A, in some embodiments, the package unit PU includes a plurality of package structures PKG and isolation regions SR1 disposed between the package structures PKG. The respective package structure PKG may include the die 110, the encapsulant 112, the RDL structure 115 and the connectors 120. The dies 110 included in different package structures PKG may be the same types of dies or different types of dies.

The encapsulant 112 laterally encapsulates sidewalls of the dies 110. In some embodiments, TIVs 102 may be optionally disposed laterally aside the die 110 and encapsulated by the encapsulant 112. The RDL structure 115 is disposed on and electrically connected to the dies 110 and/or the TIVs 102. The connectors 120 are electrically connected to the dies 110 through the RDL structure 115. In some embodiments, a dielectric layer 80 may be optionally disposed underlying the die 110 and the encapsulant 112. In some embodiments, the bottom surfaces of the encapsulant 112, the TIVs 102 and the adhesive layer 103 may be substantially coplanar with each other and in contact with the dielectric layer 80, but the disclosure is not limited thereto. In some other embodiments, the bottom surfaces of the encapsulant 112 and the TIVs 102 may be substantially coplanar with the bottom surfaces of the dies 110.

The isolation regions IR are disposed between the package structures PKG and vertically extending from the top surface of the RDL structure 115 to the bottom surface of the encapsulant 112, or extending to the bottom surface of the dielectric layer 80 (if any). In some embodiments, the isolation regions IR at least includes portions of the encapsulant 112 and the polymer layers (e.g., PM1 to PM4) of the RDL structure 115 from bottom to top, and may optionally include a portion of the dielectric layer 80. In other words, the dielectric layer 80, the encapsulant 112, and the polymer layers of the RDL structure 115 continuously extending from the package structures PKG to the isolation region IR. In some embodiments, the redistribution layers RDL1 to RDL4 are not disposed in the isolation region IR, and the redistribution layers RDL1 to RDL4 of different package structure PKG are electrically isolated from each other by the isolation region IR therebetween. In some embodiments, the isolation region IR may be free of conductive features, but the disclosure is not limited thereto.

Figure 3A:
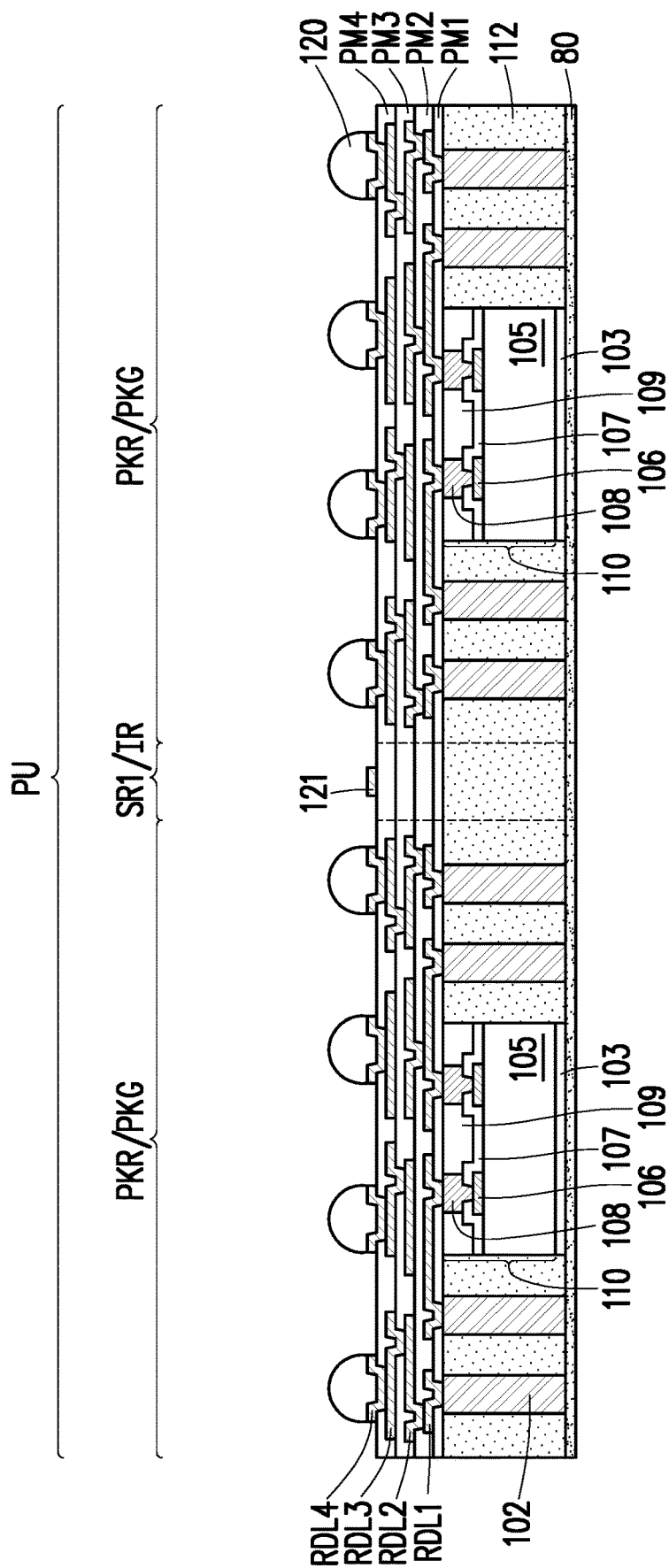
FIG. 3A and FIG. 3B are cross-sectional views illustrating package units according to some embodiments of the disclosure.
Figure 3B:
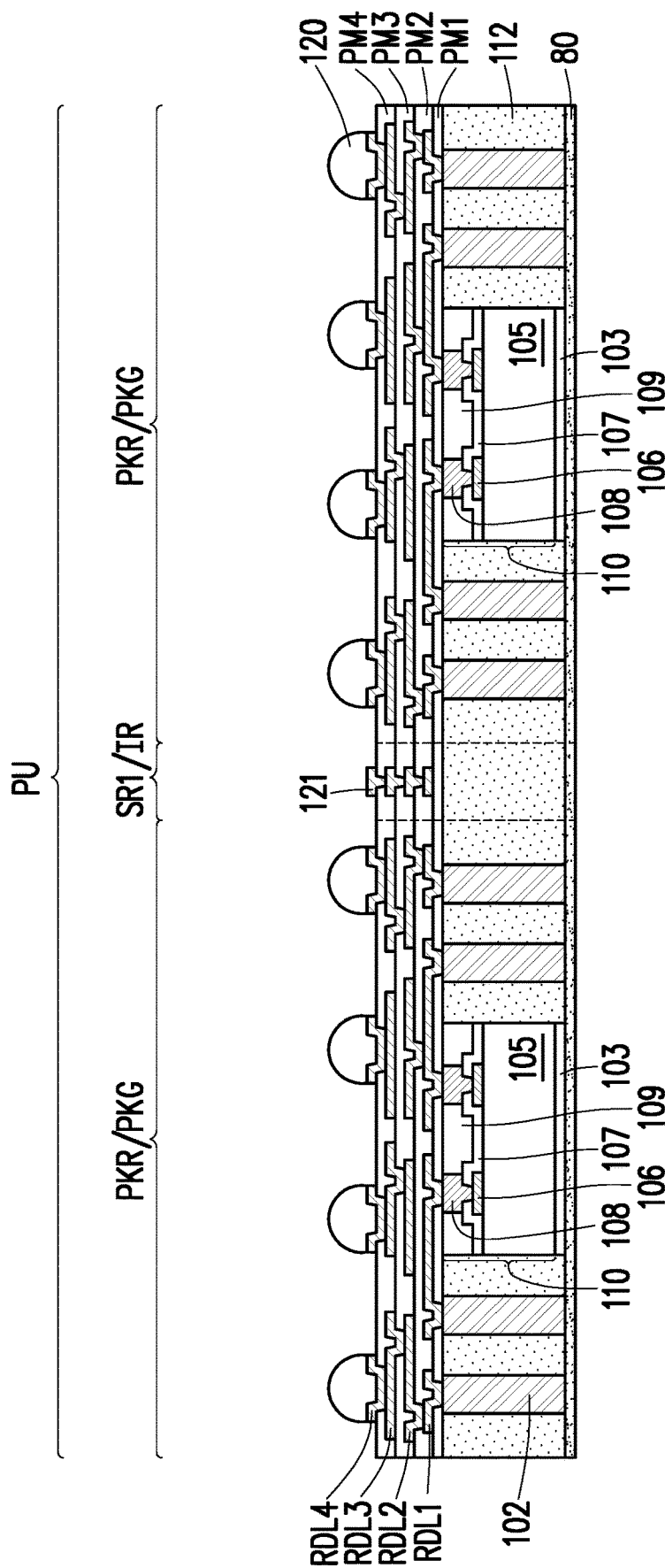

FIG. 3A and FIG. 3B are cross-sectional views illustrating package units PU according to some other embodiments of the disclosure. FIG. 4B is a top view of FIG. 3A or FIG. 3B.

Referring to 3A, FIG. 3B, and FIG. 4B, in some embodiments, the isolation region IR (i.e., scribe region) may include conductive feature(s) 121 disposed therein. The conductive feature(s) 121 may be electrically floating, that is, the conductive feature(s) 121 are electrically isolated from other conductive features (e.g., redistribution layers RDL1-RDL4) included in the package structures PKG. In some embodiments, as shown in FIG. 3A, the conductive features 121 may be disposed on the topmost surface of the polymer layers of the RDL structure 115, but the disclosure is not limited thereto. In some alternative embodiments, as shown in FIG. 3B, some of the conductive features 121 may also be embedded in the polymer layers of the RDL structure 115. Alternatively or additionally, the conductive features may also be embedded in the encapsulant 112. In some embodiments, the conductive features may include align marks, test keys, the like, or combinations thereof. It is noted that, the sizes, shapes, configurations of the conductive features 121 shown in the figures are merely for illustration, and the disclosure is not limited thereto.

Referring back to FIG. 1E and FIG. 1F, in some embodiments, the package unit PU may be further coupled to other package component. For example, the package unit PU may be mounted to a package substrate 125 through the connectors 120. The package substrate 125 may be any suitable types of package component including conductive wirings that provides electrical connection between the package structures PKG included in the package unit PU. For example, the package substrate 125 may be or include, a circuit board, a conductive interposer, a redistribution layer (RDL) structure, the like or other suitable types of connecting structure. In some embodiments, the package substrate 125 may be a build-up substrate including a core therein and various conductive features, a laminate substrate including a plurality of laminated dielectric films and conductive features formed in the dielectric films, or the like.

In some embodiments, the package substrate 125 may include a plurality of conductive pads (not shown) on top surface thereof and electrically connected to the connectors 120 of the package unit PU. In some embodiments, a plurality of the conductive connectors 130 may be disposed on a side of the package substrate 125 opposite to the connectors 120, and configured for further electrical connection. The conductive connectors 130 may include ball grid array (BGA) connectors, solder balls, controlled collapse chip connection (C4) bumps, or a combination thereof. The material of the conductive connectors 130 may be selected from the same candidate materials of the connectors 120, which are not described again here.

Figure 1F:
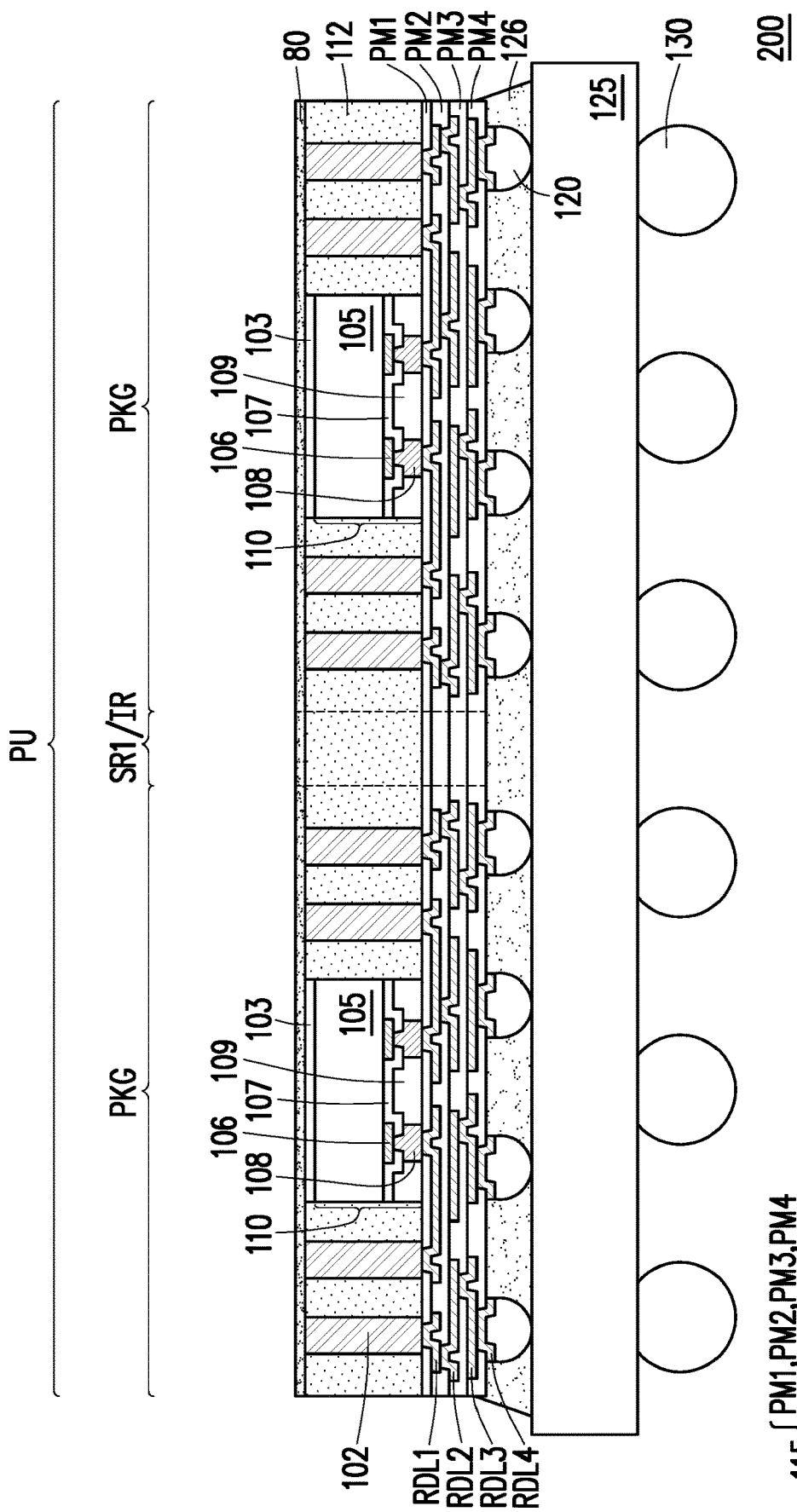

Referring to FIG. 1F, in some embodiments, an underfill layer 126 is disposed to fill the space between the package unit PU and the package substrate 125. The underfill layer 126 may cover the top surface of the package substrate 125, the bottom surface of the package unit PU, and laterally surrounds the connectors 120. In some embodiments, the underfill layer 126 may further extend upwardly to cover and contact sidewalls of the package unit PU. The underfill layer 126 may be formed by a dispensing process followed by a curing process. In some embodiments, the underfill layer 126 includes a polymer material, and may include fillers distributed in the polymer material. The material of the fillers may be selected from the same candidate materials of fillers of the encapsulant 112. For example, the fillers of the underfill layer 126 may include silicon oxide, silica, or the like. The sizes of the fillers included in the underfill layer 126 may be less than the sizes of the fillers included in the encapsulant 112. In some other embodiments, the underfill layer 126 may be free of fillers.

Still referring to FIG. 1F, a package structure 200 is thus formed. The package structure 200 includes the package unit PU including a plurality of package structures PKG, the package substrate 125 and the underfill layer 126. In the embodiments of the disclosure, the redistribution layers of the RDL structure 115 merely provide electrical connection within the respective package structures PKG, but not provide electrical connection between different package structures PKG. In some embodiments, the package structures PKG are electrically connected to each other through the package substrate 125. In other words, the package structures PKG of the package unit PU are not electrically connected to each other through the RDL structures 115, but are electrically connected to each other through the package substrate 125.

In some embodiments, the package structure PKG may also be referred to as integrated fan-out (InFO) package, and the package structure 200 may also be referred to as InFO-on-substrate package. In some embodiments, the package unit PU may also be coupled to other package component (not shown) through the TIVs 102. For example, the dielectric layer 80 on back side of the dies 110 may be patterned to form a plurality of openings in the dielectric layer 80. The openings expose the corresponding TIVs 102 for further electrical connections. Other package component (e.g., including memory devices such as dynamic random access memory (DRAM)) may then be electrically connected to the TIVs 102 by connectors disposed therebetween. The connectors may fill into the openings of the dielectric layer 80 to be electrically connected to the TIVs 102.

Figure 1G:
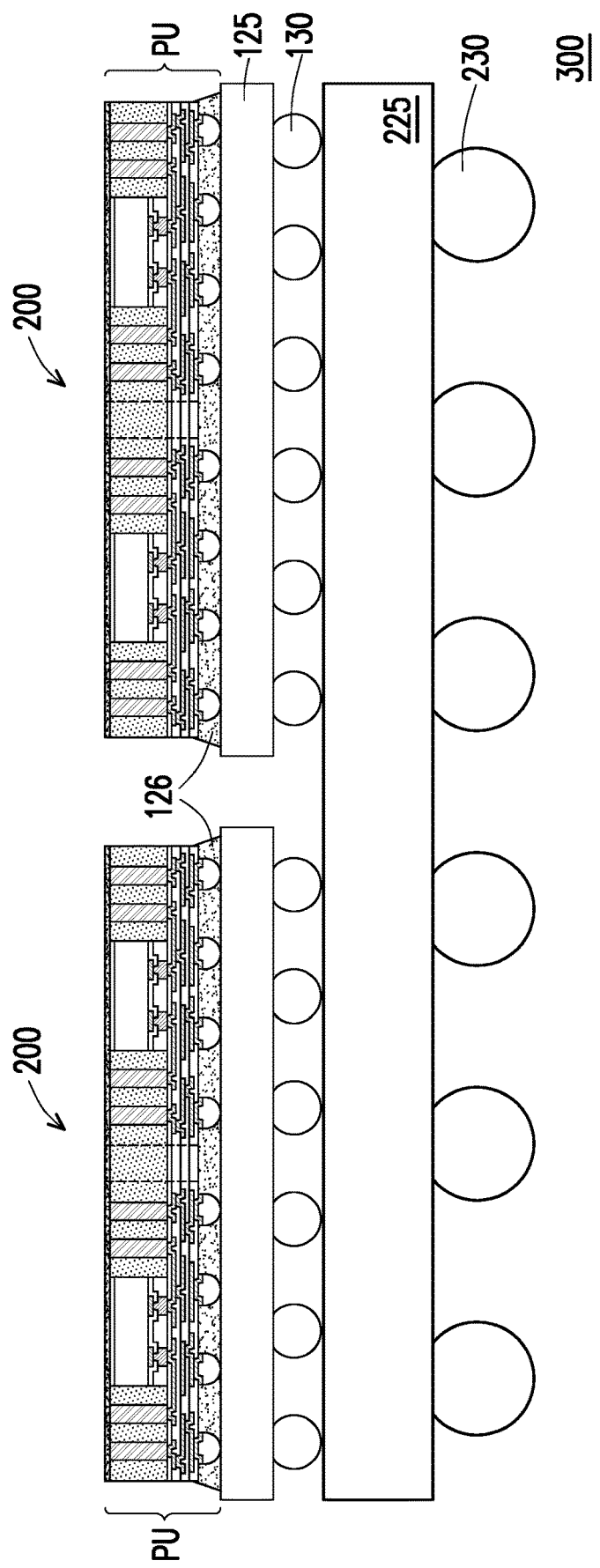

Referring to FIG. 1G, in some embodiments, one or more package structure 200 may further be coupled to other package component. For example, a plurality of package structures 200 may be further electrically connected to a package substrate 225 through the connectors 130. For example, the package substrate 225 may be a circuit board, such as printed circuit board (PCB). The package substrate 225 may include a plurality of conductive connectors 230 disposed on a side opposite to the package structures 200.

Figure 5A:
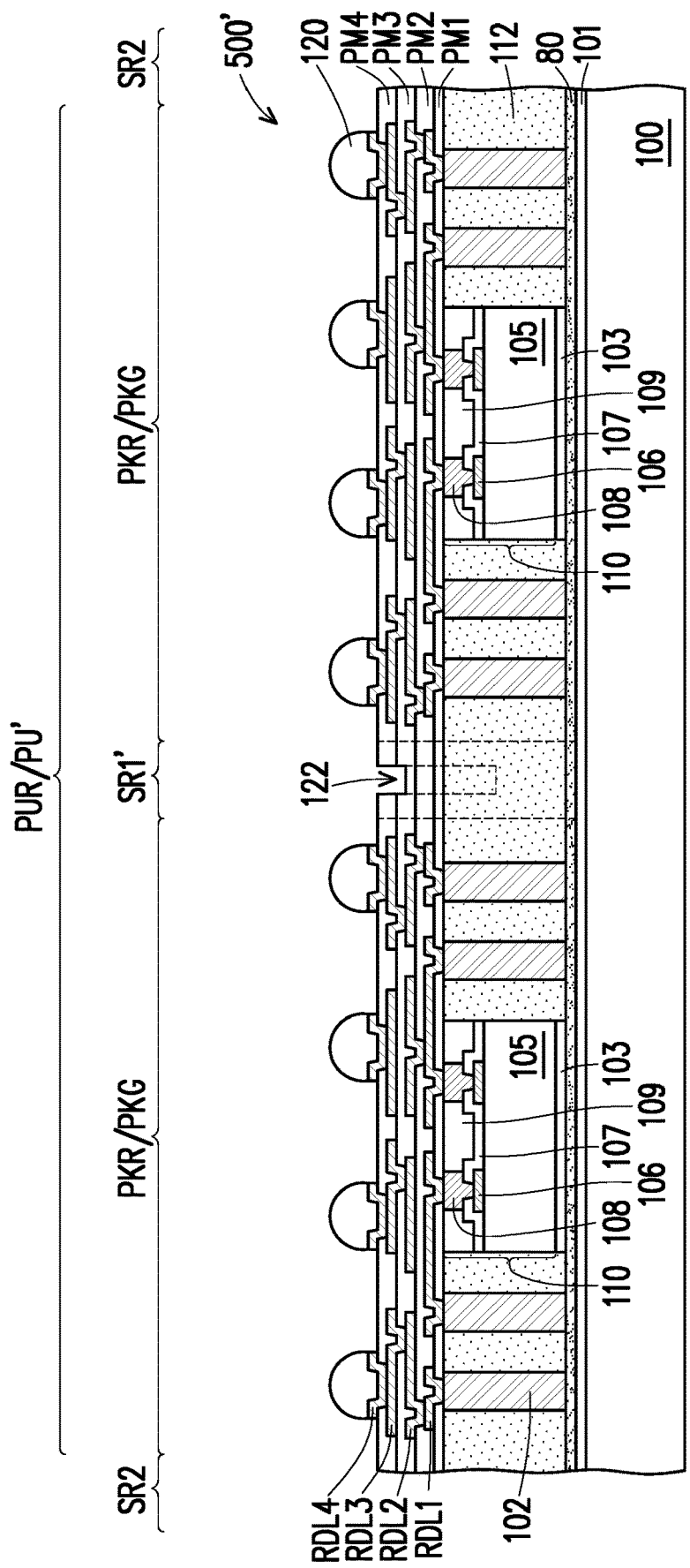
FIG. 5A to FIG. 5C are schematic cross-sectional views illustrating a method of forming a package structure according to some embodiments of the disclosure.
Figure 5B:
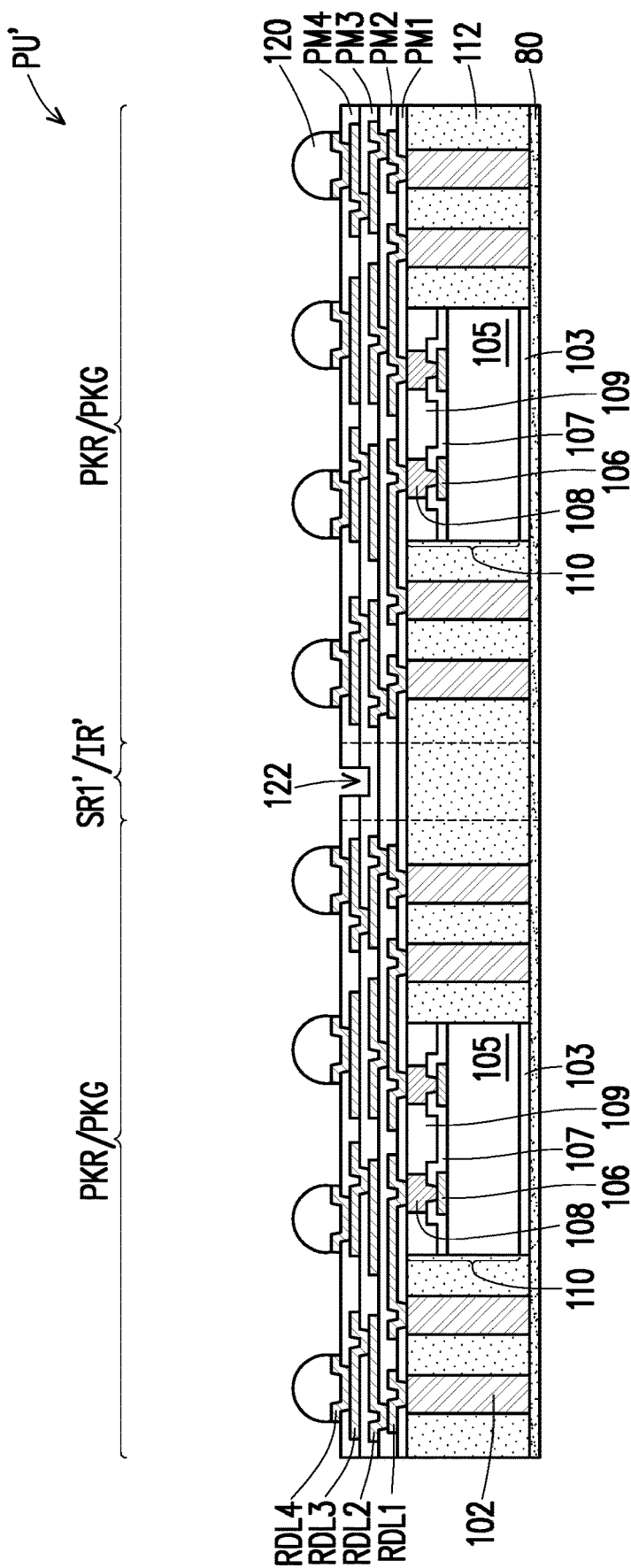
Figure 5C:
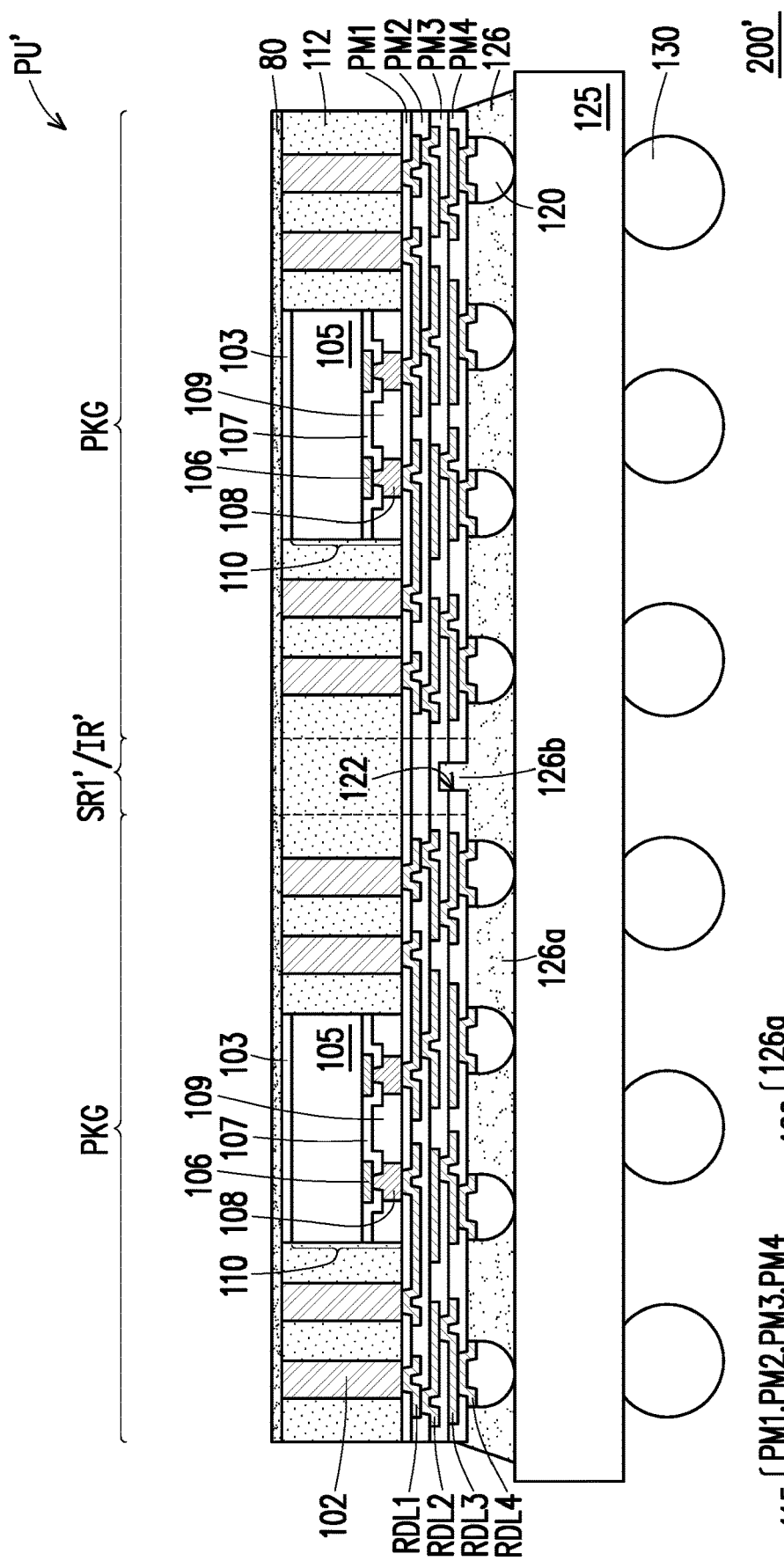

FIG. 5A to FIG. 5C are cross-sectional views illustrating a method of forming a package structure according to some other embodiments of the disclosure.

Referring to FIG. 1C and FIG. 5A, in some embodiments, after the RDL structure 115 and the connectors 120 are formed, one or more trench (or referred to as recess or opening) 122 may be formed in the scribe regions SR1 of the structure 500, and scribe regions SR1' having trench 122 are formed. The trench 122 may be formed by mechanical saw process, laser drilling process, photolithograph and etching processes, or the like, or combinations thereof. The trench 122 vertically extends from a topmost surface of the polymer layers of the RDL structure 115 (e.g., the top surface of the polymer layer PM4) to a point underlying the said topmost surface and between the topmost surface of the polymer layers and a bottommost surface of the structure 500.

For example, the trench 122 may extend from the top surface of the topmost polymer layer (e.g., PM4), penetrate through the polymer layer PM4 and extend to or into the polymer layer PM3. However, the disclosure is not limited thereto. In some other embodiments, the trench 122 may extend from the top surface of the topmost polymer layer (e.g., PM4) to a point in the polymer layer PM4 at a level height between the top surface and the bottom surface of the topmost polymer layer PM4. Alternatively, the trench 122 may extend from the top surface of the topmost polymer layer (e.g., PM4), penetrate through the polymer layers PM4 and PM3, and extend to or into the polymer layer PM2; or penetrate through the polymer layers PM4, PM3 and PM2, and extend to/into the polymer layer PM1. In other words, the trench 122 may vertically extend from the top surface of the topmost polymer layer (e.g., PM4) to a point in any polymer layers of the RDL structure 115 below the top surface of the topmost polymer layer. In yet another embodiment, the trench 122 may extend from the top surface of the topmost polymer layer PM4, penetrate through the polymer layers PM4-PM1 and extend to/into the encapsulant 112, as shown in the dotted line. In other words, the trench 122 may be formed in at least one of the polymer layers PM1-PM4, or formed in the polymer layers PM1-PM4 and the encapsulant 112. The bottom surface of the trench 122 may expose the polymer layer PM4, the polymer layer PM3, the polymer layer PM2, the polymer layer PM1, or the encapsulant 112.

In some embodiments, the trenches 122 are formed in the scribe regions SR1' within package unit regions PUR, and are not formed in the scribe regions SR2 along peripheries of the package unit regions PUR, but the disclosure is not limited thereto. In some alternative embodiments, trenches (not shown) may also be formed in the scribe regions SR2 that will be subsequently subjected to a singulation process, and the formation of trenches in the scribe regions SR2 may also be referred to as an initial singulation process.

Referring to FIG. 5A, as such, a structure 500' is formed over the carrier 100. The structure 500' is similar to the structure 500 (FIG. 1D), except that, the scribe regions SR1' within the package unit regions PUR have trench(es) 122. Referring to FIG. 5A and FIG. 5B, in some embodiments, a singulation process is then performed along the scribe regions SR2 to singulate the package units PU'. The scribe regions SR1' are not subjected to the singulation process. The singulation process may include a dicing process such as mechanical saw process, laser dicing process, the like, or combinations thereof. In some embodiments in which trenches are formed in the scribe regions SR2, the singulation process may be performed to deepen the trenches, until the scribe regions SR2 are cut through, and the package units PU' are separated from each other.

In some embodiments, both the formation of the trenches 122 in the scribe region SR1' and the singulation process along the scribe region SR2 are performed by dicing processes. For example, a first dicing process is performed at least along scribe regions SR1 within the package unit regions PUR, and the first dicing process does not cut through the scribe regions SR1, but partially cut through the scribe region SR1, so as to form the scribe region SR1' with the trench 122 therein. The scribe regions SR2 may be or may be not subjected to the first dicing process. A second dicing process is performed along scribe regions SR2 between the package unit regions PUR and cut through the scribe regions SR2, so as to singulate the package units PU' formed in the package unit regions PUR.

Referring to FIG. 5B, after the singulation process, the scribe region SR1' having trench 122 is remained in the package unit PU'. In some embodiments, the scribe region SR1' may also be referred to as an isolation region IR' between the package structures PKG. The trench 122 is disposed in the isolation region IR and vertically extends from the top surface of the topmost polymer layer of the RDL structure 115 to a point at a level height between the top surface of the topmost polymer layer and the bottom surface of the package unit PU' (e.g., a bottom surface of the dielectric layer 80 or a bottom surface of the encapsulant 112). In other words, the depth of the trench 122 is larger than 0 and less than a height of the package unit PU' between the topmost surface of the polymer layers of the RDL structure 115 and the bottommost surface of the package unit PU'. The sidewalls of the trench 122 may expose at least one of the polymer layer PM4, the polymer layer PM3, the polymer layer PM2, the polymer layer PM1 and the encapsulant 122 from top to bottom.

In some embodiments, the depth of the trench 122 may be less than 20 μm. The width of the trench 122 may be less than the width of the scribe region SR1', but the disclosure is not limited thereto. In some other embodiments, the width of the trench 122 may be substantially equal to or slightly larger than the width of the scribe region SR1. The other structural features of the package unit PU' are substantially the same as those of the package unit PU, which are not described again here.

Referring to FIG. 5B and FIG. 5C, in some embodiments, the package unit PU' may be further electrically connected to other package component (e.g., the package substrate 125) through the connectors 120. An underfill layer 126 is disposed to fill the space between the package unit PU' and the package substrate 125. As such, a package structure 200' is thus formed.

In the present embodiments, the underfill layer 126 further fills into the trench 122. In other words, the underfill layer 126 includes a body part 126a and an extension part 126b. The body part 126a of the underfill layer 126 covers the top surface of the package substrate 125 and the bottom surface of the package unit PU', and may further cover outer sidewalls of the package unit PU'. The body part 126a laterally surrounds and protects the connectors 120. The extension part 126b of the underfill layer 126 is filled in the trench 122 and embedded in the isolation region IR'.

Figure 6B:
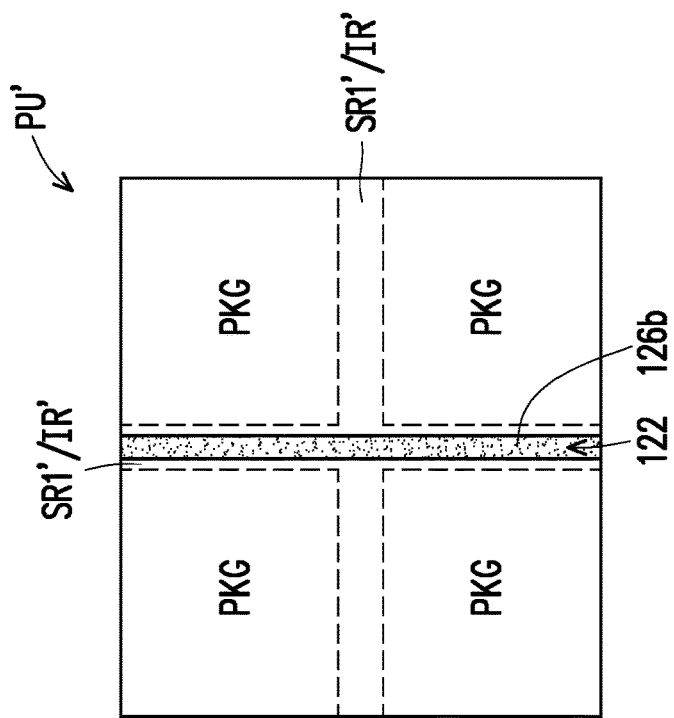
FIG. 6A to FIG. 6F illustrate plan views of package units according to some embodiments of the disclosure.
Figure 6A:
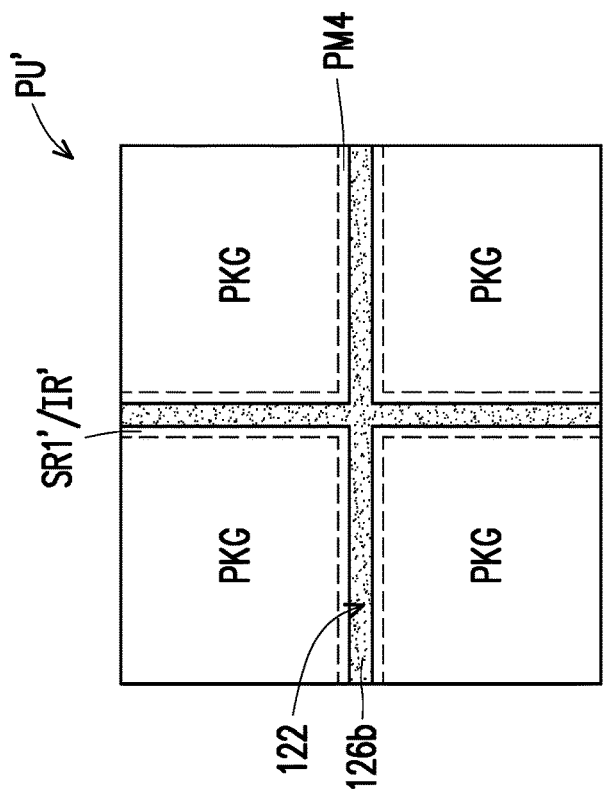

FIG. 6A illustrates a plan view of the package structure 200' along a bottom surface of the polymer layer PM4 of FIG. 5C. For the sake of brevity, the components (e.g., redistribution layers) of the package structures PKG are not specifically shown in the plan view.

Referring to FIG. 5C and FIG. 6A, in some embodiments, the trench 122 is a continuous trench extending in the isolation region IR between the package structures PKG. The extension part 126b is filled in the trench 122 and laterally between the package structures PKG. The top surface of the extension part 126b is higher than the bottom surface of the package unit PU' and located at a level height between the top surface of the package unit PU' and the bottom surface of the polymer layer PM4. The sidewalls of the extension part 126b are at least covered by and in contact with the polymer layer PM4 of the package unit PU'. In some embodiments, the sidewalls of the extension part 126b may further be covered by and in contact with the polymer layer PM3, PM2, PM1 and/or the encapsulant 112. Accordingly, the top surface of the extension part 126b may be covered by and in contact with the polymer layer PM4, PM3, PM2, PM1, or the encapsulant 122.

FIG. 6B to FIG. 6F illustrates the plan views of the package structure 200' according to some other embodiments of the disclosure.

Figure 6D:
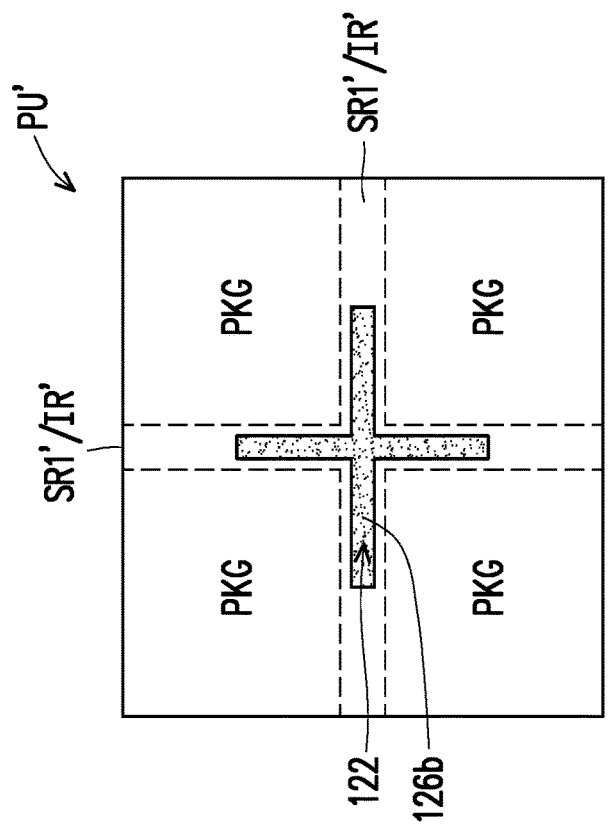
Figure 6C:
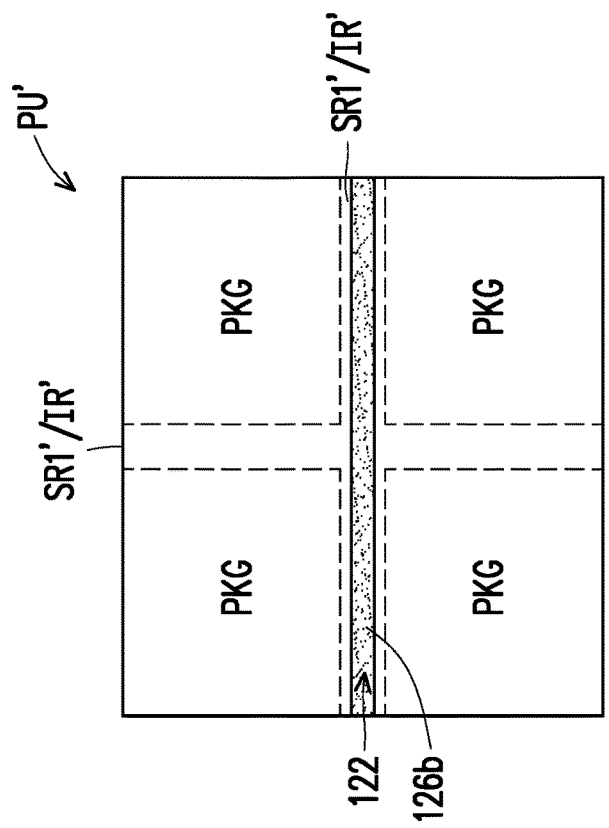
Figure 6F:
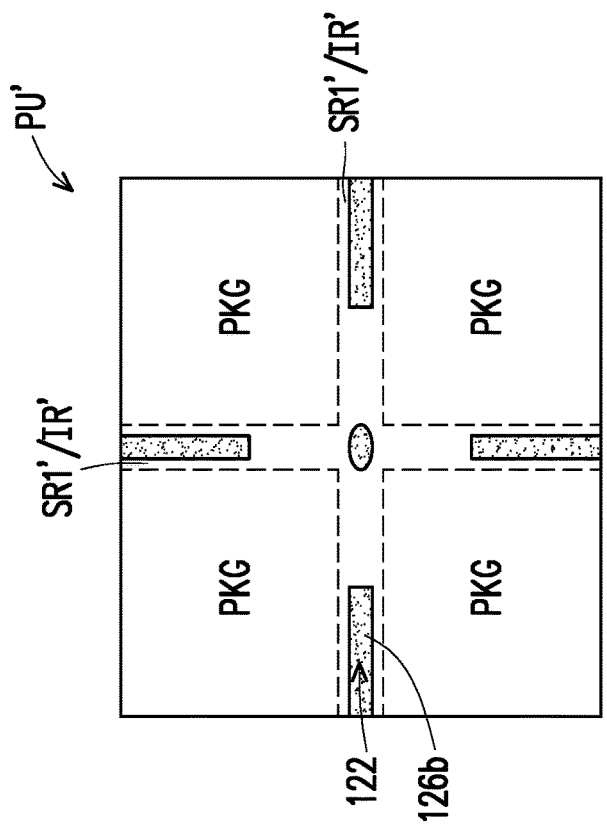
Figure 6E:
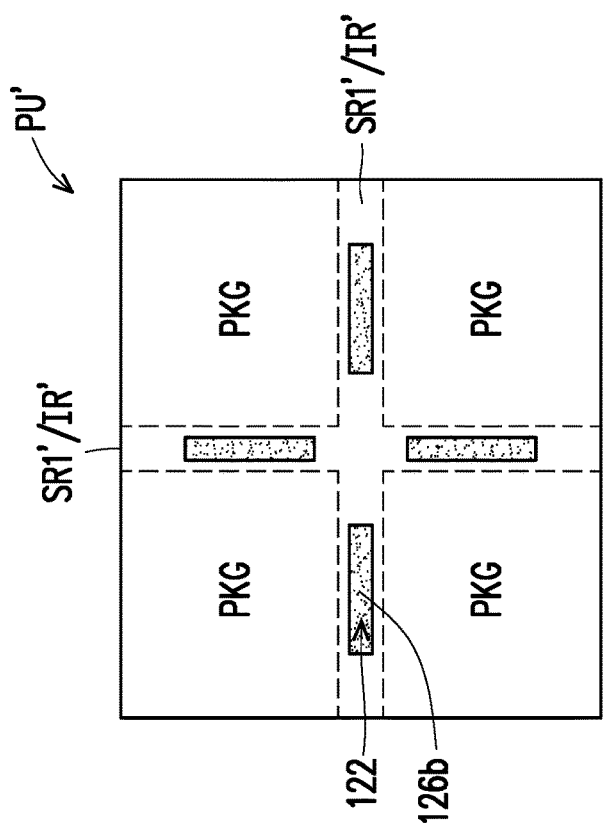

Referring to FIG. 6B to FIG. 6F, in some embodiments, the trench 122 (and the extension part 126b of the underfill layer 126 within the trench 122) may be not formed throughout the whole scribe region SR1' (i.e., isolation region IR'). Instead, a portion of the scribe region SR1' may include trench 122, while the other portion of the scribe region SR1' may not include trench 122. The ends of the trench 122 (or the extension part 126b) may be aligned with the ends of some of the package structures PKG included in the package unit PU', as shown in FIG. 6B and FIG. 6C. Alternatively, the trench 122 (or the extension part 126b) may be disposed in the scribe region SR1' and all around by the layer(s) (e.g., the polymer layer(s) of the RDL structure 115 and/or the encapsulant 112) disposed in the scribe region SR1', as shown in FIG. 6D and FIG. 6E. In some embodiments, the trench 122 may be continuous, as shown in FIG. 6A to FIG. 6D. In some other embodiments, the trench 122 may be non-continuous and includes a plurality of sections disposed in the scribe region SR1', as shown in FIG. 6E and FIG. 6F. The shape of the trench 122 in plan view may include rectangle, but the disclosure is not limited thereto. In some other embodiments, the shape of the trench 122 may include square, circular, oval, or the like, or other suitable shape. It is noted that, the configurations of the trenches 122 shown in the figures are merely for illustration, and the disclosure is not limited thereto.

Figure 7A:
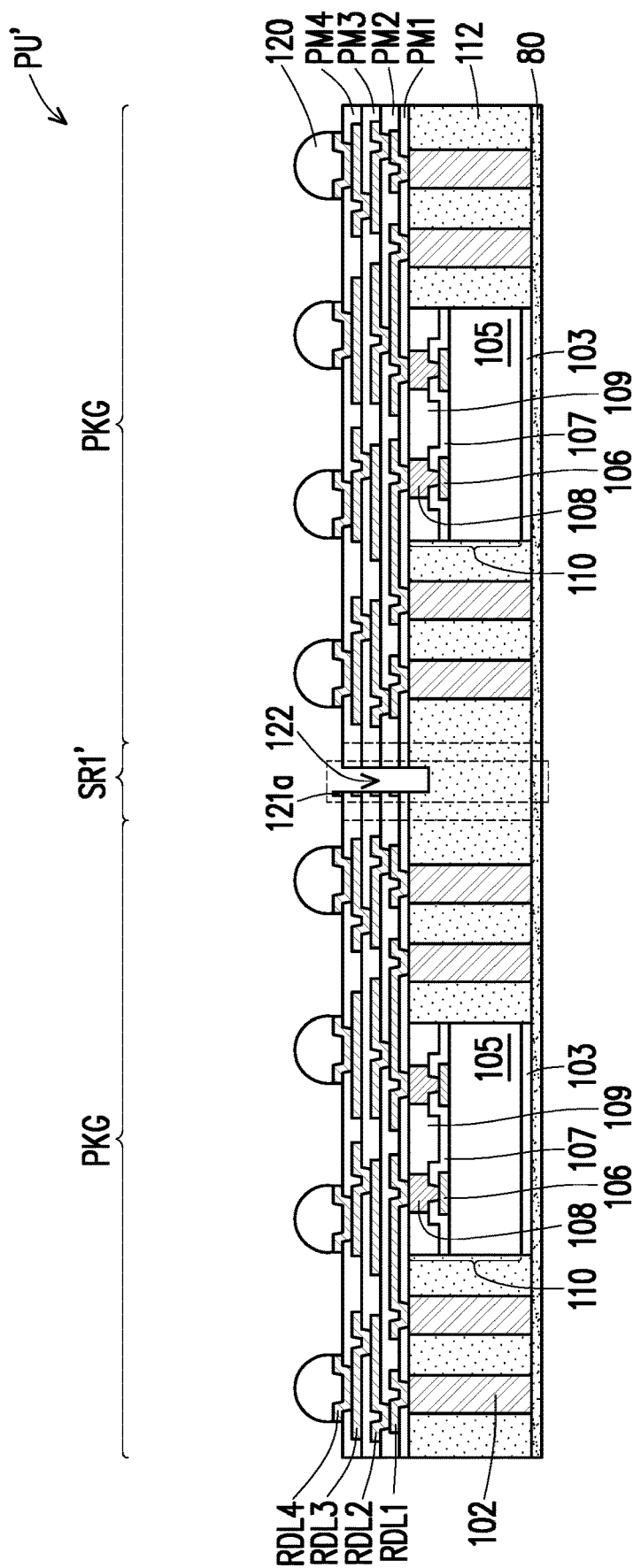
FIG. 7A and FIG. 7B are schematic cross-sectional views respectively illustrating a package unit and a package structure according to some embodiments of the disclosure.
Figure 7B:
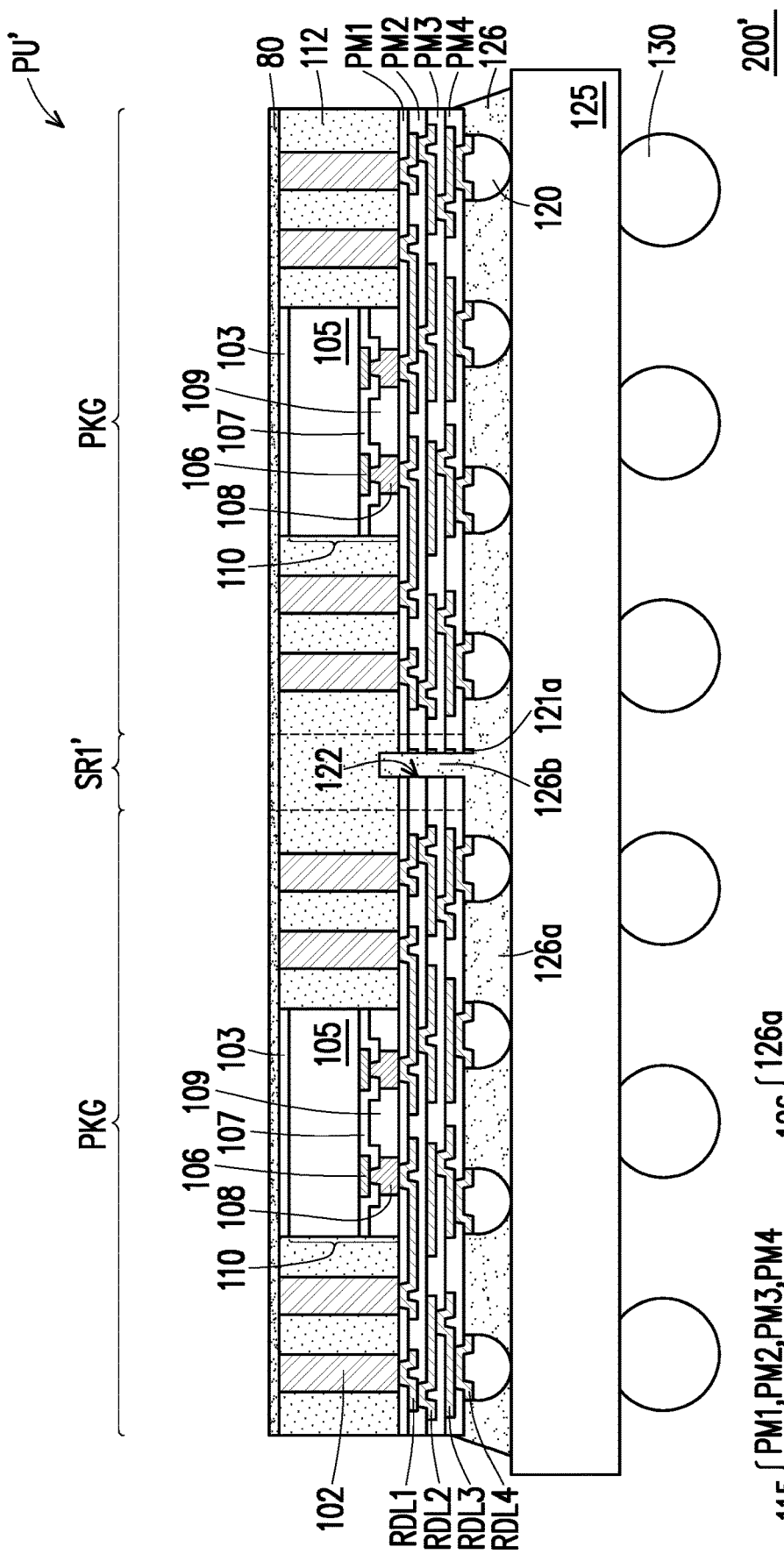

FIG. 7A and FIG. 7B illustrate cross-sectional views of package structures according to some other embodiments of the disclosure.

Referring to FIG. 7A, in some embodiments in which the package unit include both conductive features 121 and trench 122 in the scribe region SR, the conductive features 121 may be partially removed during the formation of the trench 122, and remnants of the conductive features 121a may be remained in the package unit PU' and exposed by the sidewalls and/or the bottom surface of the trench 122. However, the disclosure is not limited thereto. In some other embodiments, the conductive features 121 may be completely removed during the formation of the trench 122. Alternatively, the formation of the trench 122 does not remove the conductive features.

Referring to FIG. 7B, the package unit PU' shown in FIG. 7A may be further electrically coupled to the substrate 125 through the connectors 120, and an underfill layer 126 is disposed to fill the space between the package unit PU' and the package substrate 125. The underfill layer 126 extends to fill the trench 122 and may be in contact with the remnant of conductive features 121a. It is noted that, the shape, size and positions of the remnant of conductive features 121a shown in the figures are merely for illustration, and the disclosure is not limited thereto.

Figure 8A:
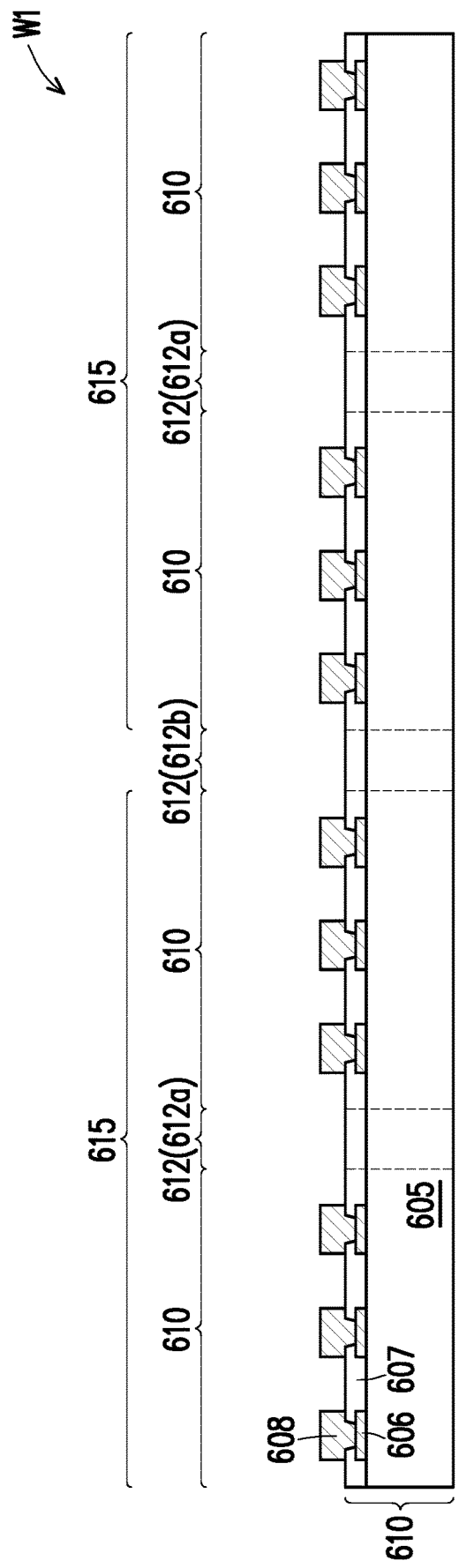
FIG. 8A to FIG. 8C are schematic cross-sectional views illustrating a method of forming a package structure according to some embodiments of the disclosure.
Figure 8B:
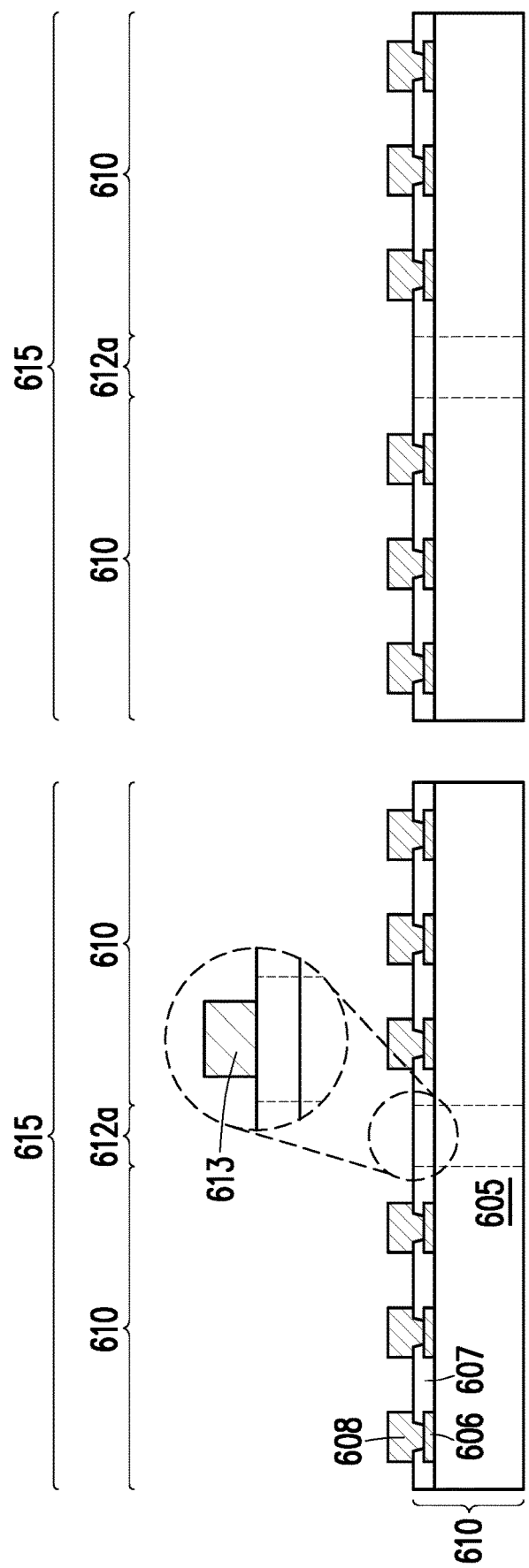
Figure 8C:
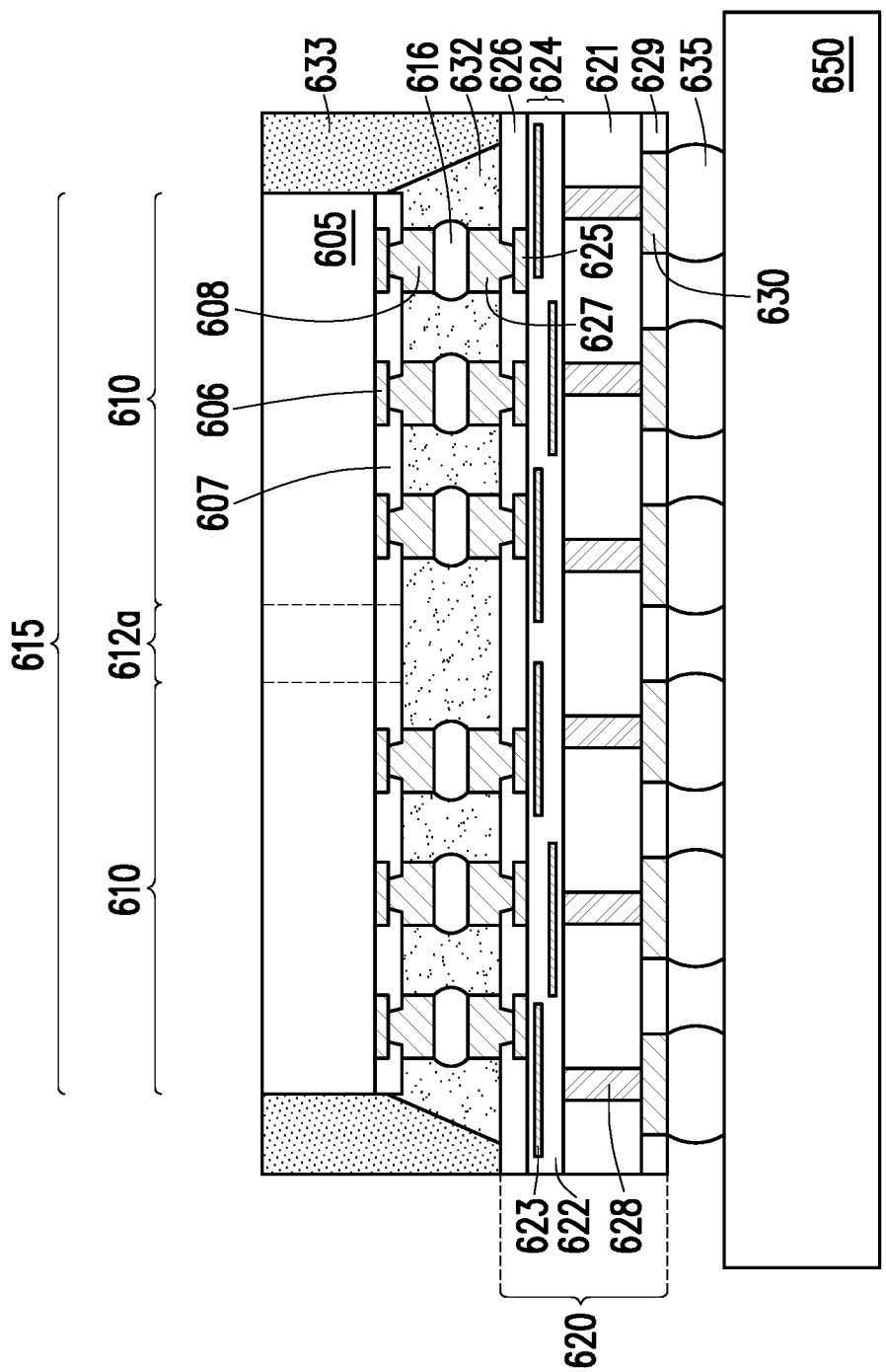
Figure 10A:
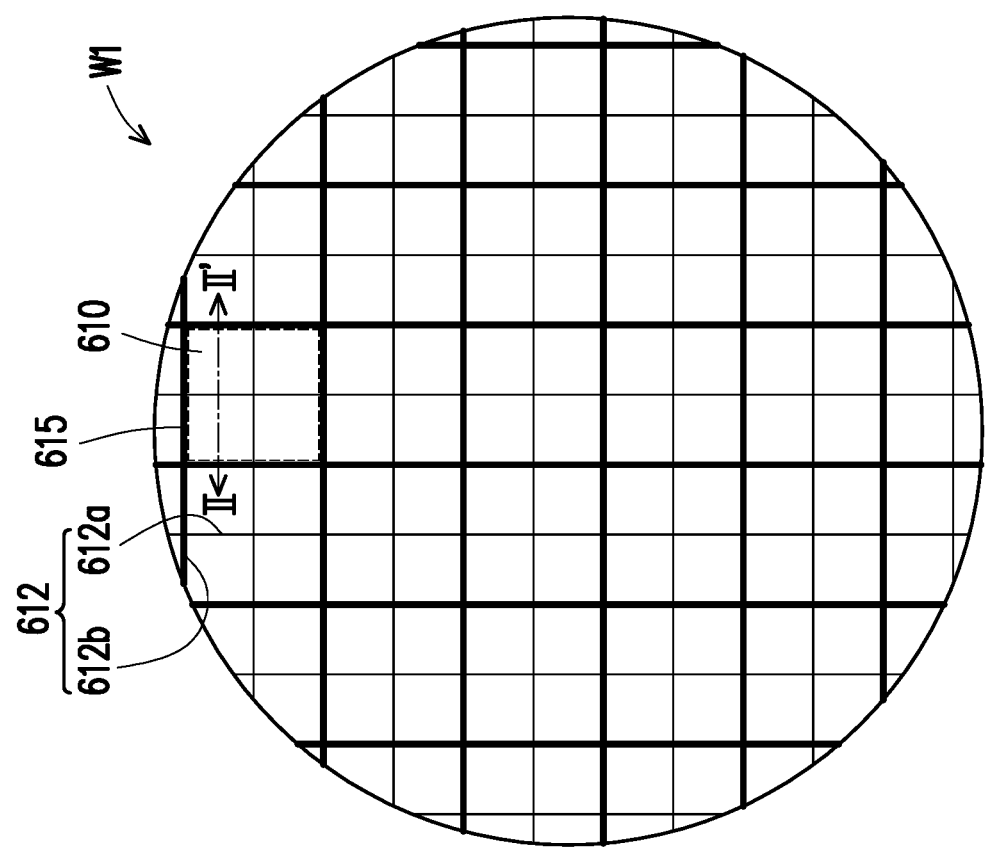
FIG. 10A and FIG. 10B illustrate top views of FIG. 8A and FIG. 8B, respectively.
Figure 10B:
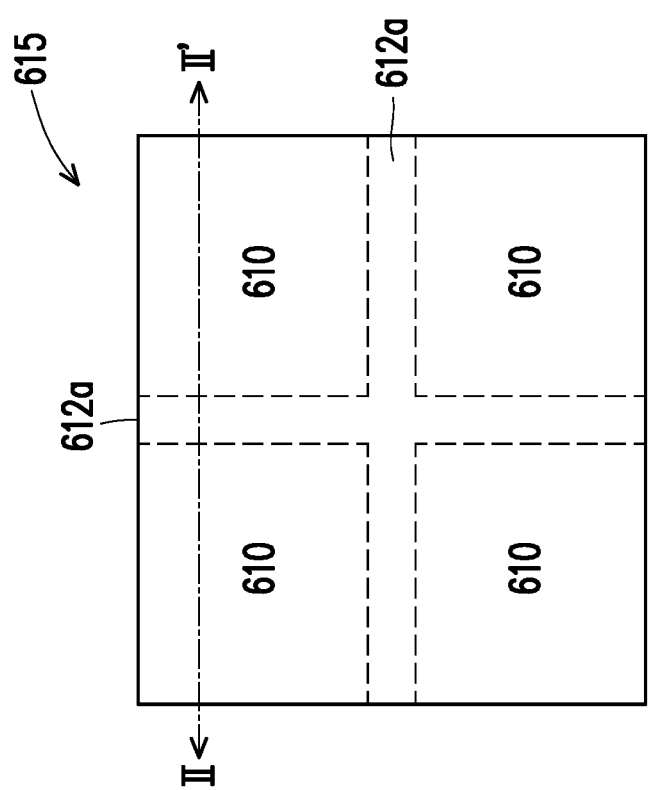

FIG. 8A to FIG. 8C are cross-sectional views illustrating a method of forming a package structure according to some other embodiments of the disclosure. FIG. 10A and FIG. 10B illustrate top views of FIG. 8A and FIG. 8B, respectively. FIG. 8A and FIG. 8B are cross-sectional views taken along lines II-II' of FIG. 10A and FIG. 10B.

Referring to FIG. 8A, in some embodiments, a wafer W1 including a plurality of dies 610 are provided. The dies 610 are spaced apart from each other by scribe regions 612 disposed therebetween. In some embodiments, at least two dies 610 and scribe region 612 therebetween constitute a die unit 615. In some embodiments, the scribe region 612 may include scribe regions 612a within the die units 615, and scribe regions 612b are disposed between the die units 615 and/or along the peripheries of the die units 615. In other words, the wafer W1 includes one or more die unit 615 each including a plurality of dies 610 and scribe region 612a. The dies 610 included in the die unit 615 may be arranged in a row, a column, or an array. For example, as shown in FIG. 10A, the die unit 615 may include four dies 610 arranged in a 2×2 array, but the disclosure is not limited thereto. In some other embodiments, the die unit 615 may include dies arranged in a 1×2 array, 3×2 array, 3×3 array, or the like, or other suitable types of configurations. It is noted that, the number, and configurations of the dies 610 included in each die unit 615 may be adjusted based on product design and requirement, and the number and/or configurations of the dies included in different die units 615 of the wafer W1 may be the same or different. Further, the number of the dies 610 included in the wafer W1 shown in the figures is merely for illustration, and the disclosure is not limited thereto.

In some embodiments, the structure of the die 610 is similar to or substantially the same as that of the die 110 described in the foregoing embodiment. For example, the die 610 may include a substrate 605, devices (not shown) disposed in and/or on the substrate 605, an interconnection structure (not shown) including a plurality of dielectric layers and conductive features (interconnect wirings) disposed in the dielectric layers, conductive pads 606, connectors 608 and a passivation layer 607. The various components of the die 610 are similar to those of the die 110, and the properties, materials and forming methods of the components in the die 610 may thus be found in the discussion referring to FIG. 1A by referring to the corresponding components in the die 110.

In some embodiments, as shown in FIG. 8A, the die 610 may be free of a passivation layer that is disposed on the passivation layer 607 and laterally surrounding the connectors 608, but the disclosure is not limited thereto. In some other embodiments, the die 610 may also include a passivation layer disposed on the passivation layer 607 and laterally covering sidewalls of the connectors 608, which is similar to the passivation layer 109 of the die 110 (FIG. 1A).

Referring to FIG. 8A and FIG. 8B, in some embodiments, a singulation process is performed on the wafer W1, so as to singulate the die units 615. The singulation process may include a mechanical saw process, a laser dicing process, or the like, or combinations of thereof. In some embodiments, the singulation process is performed along the scribe regions 612b that are disposed between and/or along peripheries of the die units 615, while the scribe regions 612a within the die units 615 are not subjected to the singulation process and are remained in the singulated die units 615. In some embodiments, the remained scribe region 612a in the die unit 615 may also be referred to as isolation regions.

Referring to FIG. 8B and FIG. 10B, the die unit 615 includes dies 610 and isolation region 612a disposed between the dies 610. The die unit 615 may also be referred to as semiconductor structure unit, and the dies 610a included in the die unit 615 may also be referred to as semiconductor structures. The dies 610 are electrically isolated from each other by the isolation region 612a therebetween. In some embodiments, the isolation region 612a includes the substrate 605, the plurality of dielectric layers of the interconnection structure, and the passivation layer 607 from bottom to up. In other words, the substrate 605, the dielectric layers and the passivation layer 607 continuously extend form the dies 610 to the isolation regions 612a. It is noted, the interconnect wirings of the interconnection structure are respectively disposed in the corresponding dies 610 and are not disposed in the isolation region 612a. In some embodiments, the isolation region 612a may be free of conductive features. In some other embodiments, as shown in the enlarged view, the isolation region (i.e., scribe region) 612a may include conductive features 613 (such as align mark, test key, or the like or combinations thereof) which may be disposed over the substrate 605. In some embodiments, the conductive features 613 may be disposed on the top surface of the passivation layer 607, but the disclosure is not limited thereto. Additionally or alternatively, the conductive features 613 may be embedded in the passivation layer 607 and/or embedded in the dielectric layers over the substrate 605.

In some embodiments, the die unit 615 may be applied to various types of package structures, such as InFO package, 3DIC, chip-on-wafer (CoW), chip-on-wafer-on-substrate (CoWoS), or other suitable types of packages. For example, the die 110 of the package structure PKG in FIG. 1E may be replaced by the die unit 615. The package structure PKG may be a singulated package or included in a package unit.

FIG. 8C illustrate an example of integrating the die unit 615 in package structure 1000, which is a CoWoS package.

Referring to FIG. 8C, in some embodiments, the die unit 615 is electrically bonded to an interposer (or referred to as a conductive interposer) 620, for example, in a flip-chip manner. Conductive connectors 616 may be disposed between the die unit 615 and the interposer 620 to provide electrical connection therebetween.

The interposer 620 may include a substrate 621, an interconnection structure 624, a plurality of conductive pads 625, a passivation layer 626, a plurality of connectors 627, conductive vias 628, a dielectric layer 629, and conductive patterns 630.

In some embodiments, the substrate 621 is a semiconductor substrate, and the material of the substrate 621 is similar to, and may be the same as or different from those of the substrate 100 of the die 110 (FIG. 1A). For example, the substrate 621 is a silicon substrate. In some embodiments, the substrate 621 is a blank silicon substrate, and is free of devices formed therein and/or thereon, but the disclosure is not limited thereto. In alternative embodiments, the substrate 621 may also include devices (e.g., active and/or passive devices) formed therein and/or thereon.

The interconnection structure 624 is disposed on the front side of the substrate 621 and may include a structure similar to that of the interconnection structure of the die 110 (FIG. 1A). For example, the interconnection structure 624 includes a dielectric structure 622 and a plurality of conductive features 623. The conductive features 623 may be embedded in the dielectric structure 622 and may include multi-layers of conductive lines and conductive vias (not shown) stacked alternately; the conductive vias may be disposed vertically between the conductive lines so as to electrically connect the conductive lines in different tiers. The materials of the conductive features 623 and the dielectric structure 622 may be selected from the same candidate materials of the interconnect wirings and the dielectric layers of the interconnection structure of the die 110, which are not described again here.

The conductive pads 625 may be or electrically connected to a top conductive feature of the interconnection structure 624. The passivation layer 626 partially covers the conductive pads 625. The connectors 627 are disposed on the conductive pads 625 exposed by the passivation layer 626 and electrically connected to the conductive pads 625. The materials of the conductive pads 625, the passivation layer 626 and the connectors 627 may be selected from the same candidate materials of the pads 106, the passivation layer 107 and the connectors 108 (FIG. 1A), respectively.

The conductive vias 628 are embedded in the substrate 621 and are electrically connected to the interconnect structure 624. In some embodiments, the conductive vias 628 penetrate through the substrate 621 and may also be referred to as through substrate vias (TSVs). In some embodiments, dielectric liners (not shown) are disposed between the conductive vias 628 and the substrate 621 to separate the conductive vias 628 from the substrate 621. For example, the dielectric liners may surround the sidewalls of the conductive vias 628 and sandwiched between the conductive vias 628 and the substrate 621, respectively. The conductive vias 628 may include copper, copper alloys, aluminum, aluminum alloys, Ta, TaN, Ti, TiN, CoW or combinations thereof. The dielectric liner may include dielectric material, such as silicon oxide, silicon nitride, silicon oxynitride or the like, or combinations thereof. The conductive vias 628 may extend into the interconnect structure 624 to be in physical and electrical contact with the conductive features 623 of the interconnect structure 624. In some embodiments, the conductive vias 628 extend through the substrate 621 and are revealed at the back surface of the substrate 621.

In some embodiments, the interposer 620 includes one or more dielectric layer 629 disposed on back side of the substrate 621, and one or more tiers of conductive patterns 630 are formed in the one or more dielectric layer 629 to electrically connect to the conductive vias 628. The dielectric layer 629 may include silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. Alternatively or additionally, the dielectric layer 629 may include a polymer material, such as PBO, PI such as low temperature (LTPI), BCB, a combination thereof or the like. The conductive patterns 630 may include metal such as copper, nickel, titanium, aluminum, tungsten, silver, combinations thereof or the like. In some embodiments, the conductive patterns 630 are used to electrically connect the conductive vias 628 together and/or electrically connect the conductive vias 628 to external components or devices. The conductive patterns 630 may include conductive vias and/or traces electrically connected to the conductive vias 628. In some embodiments, the conductive patterns 630 may also be referred to as redistribution layers. In some embodiments, the conductive patterns 630 includes conductive pads.

It is noted that, the interposer 620 described and shown herein is merely for illustration, and the disclosure is not limited thereto. Other suitable types of interposer providing electrical connection between the dies 610 of the die unit 615, and/or between the dies 110 and the package substrate 650 may also be applied in the disclosure and are within the scope of the present disclosure. For example, an organic interposer may be used. The organic interposer may include a plurality of polymer layers and a plurality of redistribution layers (RDLs) formed in and/or on the polymer layers. The polymer layers include polymer materials such as PI, PBO, BCB, or the like, or combinations thereof. The redistribution layers include multi-layers of conductive vias and conductive traces electrically connected to each other. The redistribution layers provide electrical connection between the dies 610 of the die unit 615 and the package substrate 650. The organic interposer may also be referred to as an RDL interposer.

Still referring to FIG. 8C, in some embodiments, an underfill layer 632 is disposed to fill the space between the die unit 615 and the interposer 620. The material of the underfill layer 632 is similar to or substantially the same as that of the underfill layer 126 described above. For example, the underfill layer 632 may include a polymer material, such as resin, and may include or be free of fillers therein. In some embodiments, the underfill layer 632 laterally surrounds the connectors 608 of the dies 610, the connectors 627 of the interposer 620 and the conductive connectors 616. The underfill layer 632 may partially cover the top surface of the interposer 620, and may partially or completely cover the bottom surfaces (i.e., front surfaces) of the die unit 615. In some embodiments, the underfill layer 632 may further extend to partially cover sidewalls of the dies 110. In other words, the bottom corners of the dies 110 may be covered by the underfill layer 632.

In some embodiments, an encapsulant 633 may be formed on the interposer 620 to encapsulate the die unit 615 and the underfill layer 632. The material of the encapsulant 633 may be selected from the same candidate materials of the encapsulant 112 described in the above embodiment, and the material of the encapsulant 633 may be the same as or different from that of the encapsulant 112. For example, the encapsulant 633 includes a molding compound which is a composite material including a base material (such as polymer) and a plurality of fillers distributed in the base material.

In some embodiments, the interposer 620 with die unit 615 is disposed on a package substrate 650. Conductive connectors 635 may be disposed between the interposer 620 and the package substrate 650 to provide the electrical connection therebetween. The package substrate 650 may be a build-up substrate including a core therein and various conductive features, a laminate substrate including a plurality of laminated dielectric films and conductive features formed in the dielectric films. In some embodiments, the package substrate 650 may be a circuit substrate, such as a printed circuit board (PCB). In some embodiments, the package substrate 650 includes a plurality of conductive pads (not shown) disposed on top surface thereof, and the connectors 635 are electrically connected to the conductive pads. In some embodiments, the package substrate 650 may include connectors (not shown) disposed on a bottom surface thereof for further electrical connection.

Figure 9C:
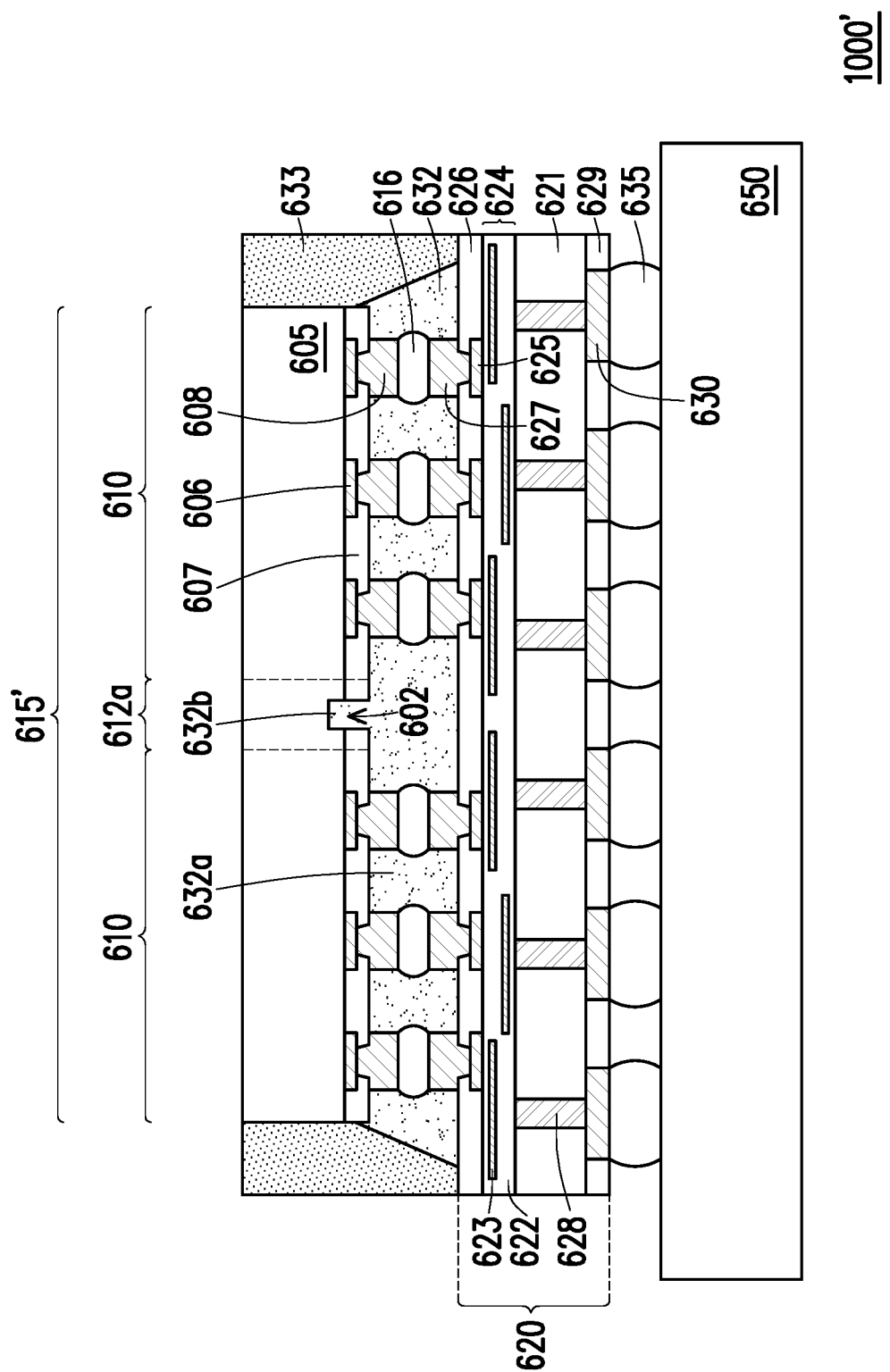

FIG. 9A to FIG. 9C are cross-sectional views illustrating a method of forming a package structure according to some other embodiments of the disclosure. The present embodiment is similar to the embodiments illustrated in FIG. 8A to FIG. 8C, except that trench(es) 602 are formed in the scribe region of the die unit.

Referring to FIG. 9A, in some embodiments, trenches 602 are at least formed in the scribe regions 612a within the die unit 615'. The method for forming the trenches 602 are substantially the same as the forming method of the trenches 122 (FIG. 5A) described in the above embodiments, which is not described again here. In some embodiments, the trench 602 extends from a top surface of the passivation layer 607 to a point at a level height vertically between the top surface of the passivation layer 607 and the bottom surface of the substrate 605. For example, the trench 602 may be formed within the passivation layer 607. Alternatively, the trench 602 may extend into a dielectric layer in any tier of the interconnection structure or extend into the substrate 605. In other words, the sidewalls of the trench 602 may expose the passivation layer 607, the dielectric layers of the interconnection structure, and/or the substrate 605 from top to bottom. Accordingly, depending on the depth of the trench 602, the bottom surface of the trench 602 may expose the passivation layer 607, or a dielectric layer of the interconnection structure, or the substrate 605. In some embodiments in which the scribe region 612a includes conductive features therein, the conductive features may be not removed during the formation of the trenches 602. Alternatively, the conductive features may be completely removed during the formation of the trenches 602. In yet another embodiment, the conductive features may be partially removed during the formation of the trenches 602, and the remnant of conductive features may be remained on the top surface of the passivation layer 607 and/or embedded in the scribe region 612a. In some embodiments, the remnant of the conductive features that are embedded in the scribe region 612a may be exposed by sidewalls and/or the bottom surface of the trenches 602, which is similar to those shown in FIG. 7A. In some embodiments, the other structural features of the trenches 602 may be similar to, substantially the same as or different from those of the above-described trenches 122.

In some embodiments, during the formation of the trenches 602 in the scribe region 612a, trenches are not formed in the scribe region 612b, but the disclosure is not limited thereto. In alternative embodiments, during the formation of the trenches 612a in the scribe regions 612a, trenches (not shown) may be also formed in the scribe regions 612b.

Referring to FIG. 9A and FIG. 9B, a singulation process is performed along the scribe region 612b to singulate the die units 615'. The scribe regions 612a within the die unit 615' are not subjected to the singulation process. In some embodiments in which trenches (not shown) are formed in the scribe region 612b, the singulation process may be performed to deepen the trenches, until the scribe region 612b is cut through, and the die units 615' are separated from each other.

Although the trenches 602 in the scribe region 612a are illustrated to be formed before the singulation process, but the disclosure is not limited thereto. In some other embodiments, the trenches 602 may be formed in the scribe region 602 after the singulation process is performed.

Referring to FIG. 9C, in some embodiments, the die unit 615' may be further electrically connected to an interposer 620, and the interposer 620 may be further electrically bonded to a package substrate 650, so as to form a package structure 1000', which is a CoWoS package. The package structure 1000' is similar to the package structure 1000 described in FIG. 8C, except that the underfill layer 632 further extends to fill the trench 602.

In other words, the underfill layer 632 includes a body part 632a and an extension part 632b. The body part 632a is disposed to fill the space between the die unit 615' and the interposer 620 and laterally surrounds the connectors 616. The extension part 632b is filled in the trench 602 and embedded in the isolation region 612a of the die unit 615'. The sidewalls of the extension part 632b are at least covered by and in physical contact with the passivation layer 607. In some embodiments, the sidewalls of the extension part 632b may be covered by and in physical contact with the dielectric layers of the interconnection structure and/or the substrate 605. The top surface of the extension part 632b may be covered by and in physical contact with the passivation layer 607, or a dielectric layer of the interconnection structure, or the substrate 605.

In the embodiments of the disclosure, a plurality of semiconductor structures may be integrated in a package structure, the semiconductor structures (e.g., package structures or dies) may be included in a semiconductor structure unit (e.g., package unit or die unit) and are not singulated during the singulation process. As such, the fabrication process (e.g., singulation process) may be simplified and the fabrication cost (e.g., cost for singulation process and/or cost for the encapsulating material used in subsequent packaging process) may be reduced. In some embodiments, trenches (recesses) may be formed in the scribed regions within the semiconductor unit, which may facilitate the flow of the underfill material between the semiconductor structure unit and the underlying package substrate, thereby improve the reliability of the resulted package structure.

In accordance with some embodiments of the disclosure, a package structure includes a semiconductor unit, a package component and an underfill layer. The semiconductor structure unit includes a first semiconductor structure and a second semiconductor structure disposed as side by side, and an isolation region laterally between the first semiconductor structure and the second semiconductor structure. The isolation region vertically extends from a top surface to a bottom surface of the semiconductor structure unit. The semiconductor structure unit is disposed on and electrically connected to the package component. The underfill layer is disposed to fill a space between the semiconductor structure unit and the package component.

In accordance with alternative embodiments of the disclosure, a package structure includes a package unit, a package substrate and an underfill layer. The package unit includes a first package region, a second package region and an isolation region laterally between the first package region and the second package region; a first die and a second die, respectively disposed in the first package region and the second package region; an encapsulant, encapsulating sidewalls of the first die and the second die and continuously extending from the first and second package regions to the isolation region; a redistribution layer (RDL) structure, disposed on the first die, the second die and the encapsulant, the RDL structure comprises: polymer layers, continuously extending from the first and second package regions to the isolation region; first redistribution layers and second redistribution layers, embedded in the polymer layers, disposed within the first package region and the second package region and electrically connected to the first die and the second die, respectively, wherein the first redistribution layers and the second redistribution layer are isolated from each other by the isolation region therebetween; and connectors, electrically connected to the first die and the second die through the first redistribution layers and the second redistribution layers, respectively. The package substrate is electrically connected to the package unit. The underfill layer is disposed to fill a space between the package unit and the package substrate.

In accordance with some embodiments of the disclosure, a method of forming a package structure include: forming an initial structure comprising semiconductor structures and scribe regions between the semiconductor structures, at least two of the semiconductor structures and a first portion of the scribe regions between the at least two of the semiconductor structures constitute a semiconductor structure unit; performing a singulation process along a second portion of the scribe regions along a periphery of the semiconductor structure unit, so as to singulate the semiconductor structure unit from the initial structure, wherein the first portion of the scribed regions is remained in the semiconductor structure unit and serve as an isolation region between the at least two of the semiconductor structures; electrically connecting the semiconductor structure unit to a package component; and forming an underfill layer to fill a space between the semiconductor structure unit and the package component.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a semiconductor structure unit, comprising:
a first semiconductor structure and a second semiconductor structure disposed as side by side;
at least one dielectric layer and a plurality of conductive features embedded in the at least one dielectric layer, under the first semiconductor structure and the second semiconductor structure;
an encapsulant, encapsulating the first semiconductor structure, the second semiconductor structure and the at least one dielectric layer; and
a package component, wherein the semiconductor structure unit is disposed on and electrically connected to the package component; and
an underfill layer, disposed between the semiconductor structure unit and the package component, wherein the underfill layer comprises an extension part embedded in at least one dielectric layer.

2. The package structure of claim 1, wherein the first semiconductor structure and the second semiconductor structure are electrically connected to each other through the package component.

3. The package structure of claim 1, wherein the semiconductor structure unit is a package unit, the first semiconductor structure and the second semiconductor structure are respectively a first package structure comprising a first die and a second package structure comprising a second die.

4. The package structure of claim 1, wherein the semiconductor structure unit is a die unit, the first semiconductor structure and the second semiconductor structure are respectively a first die and a second die, the die unit comprises a semiconductor substrate and the at least one dielectric layer and a plurality of conductive features, and the at least one dielectric layer comprises a plurality of dielectric layers and a passivation layer continuously extending from the first die to the second die.

5. The package structure of claim 4, wherein a scribe region is disposed between the first die and the second die, and the extension part is extending from a surface of the passivation layer to a point at a level height between the surface of the passivation layer and a back surface of the semiconductor substrate.

6. A package structure, comprising:
a package unit, comprising:
a first package region, a second package region and an isolation region laterally between the first package region and the second package region;
a first die and a second die, respectively disposed in the first package region and the second package region;
an encapsulant, encapsulating sidewalls of the first die and the second die and continuously extending from the first and second package regions to the isolation region;
a redistribution layer (RDL) structure, disposed on the first die, the second die and the encapsulant, continuously extending from the first and second package regions to the isolation region, and comprising a plurality of dielectric layers and first redistribution layers and second redistribution layers embedded in the dielectric layers;
connectors, electrically connected to the first die and the second die through the first redistribution layers and the second redistribution layers, respectively;
at least one conductive feature, in direct contact with at least one of the dielectric layers of the RDL structure and being electrical floating;
a package substrate, electrically connected to the package unit; and
an underfill layer, disposed between the package unit and the package substrate, wherein the RDL structure is disposed between the encapsulant and the underfill layer.

7. The package structure of claim 6, wherein the at least one conductive feature comprises conductive features in the isolation region, and the conductive features are stacked and physically connected to each other.

8. The package structure of claim 7, wherein the conductive features comprise an align mark, a test key, or a combination thereof.

9. The package structure of claim 6, wherein the isolation region comprises a recess vertically extending from a bottom surface of the dielectric layers facing the package substrate to a point at a level height between a bottom surface of the dielectric layers and a top surface of the package unit.

10. The package structure of claim 9, wherein a top surface of the underfill layer is covered by one of the dielectric layers or the encapsulant and is higher than the bottom surface of the dielectric layers.

11. A method of forming a package structure, comprising:

forming an initial structure comprising semiconductor structures and scribe regions between the semiconductor structures, at least two of the semiconductor structures and a first portion of the scribe regions between the at least two of the semiconductor structures, and at least one dielectric layer and a plurality of conductive features embedded in the at least one dielectric layer constitute a semiconductor structure unit, wherein the at least one dielectric layer extends across the first portion of the scribe regions and the at least two of the semiconductor structures;

patterning the first portion of the scribe regions to form a recess in the at least one dielectric layer at the first portion of the scribe regions;

performing a singulation process along a second portion of the scribe regions along a periphery of the semiconductor structure unit, so as to singulate the semiconductor structure unit from the initial structure, wherein the first portion of the scribed regions is remained in the semiconductor structure unit and serve as an isolation region between the at least two of the semiconductor structures;

electrically connecting the semiconductor structure unit to a package component; and forming an underfill layer to fill a space between the semiconductor structure unit and the package component, wherein the underfill layer further extends to fill the recess and embed in the at least one dielectric layer.

12. The method of claim 11, wherein the semiconductor structures are package structures, and forming the initial structure comprises:

providing a plurality of dies over a carrier within package regions;

forming an encapsulant to encapsulate sidewalls of the dies, the encapsulant continuously extending from the package regions to the scribe regions;

forming a redistribution layer (RDL) structure over the dies and the encapsulant, the RDL structure comprises the at least one dielectric layer and the conductive features, the at least one dielectric layer comprises dielectric layers and the conductive features comprise redistribution layers, the redistribution layers are electrically connected to the dies respectively and isolated from each other by the dielectric layers disposed in the scribe regions; and releasing the carrier.

13. The method of claim 11, wherein the semiconductor structures are semiconductor dies included in a semiconductor wafer.

14. The method of claim 11, wherein patterning the first portion of the scribe regions comprises photolithography and etching processes or a dicing process.

15. The method of claim 11, wherein forming the recess and performing the singulation process comprises:

performing a first dicing process along the first portion of the scribe regions without cutting through the initial structure, so as to form the recess; and performing a second dicing process along the second portion of the scribe regions to cut through the initial structure and singulate the semiconductor structure unit.

16. The package structure of claim 1, wherein a sidewall of the at least one dielectric layer is substantially flush with a sidewall of the first semiconductor structure.

17. The package structure of claim 1, wherein a sidewall of the at least one dielectric layer is substantially flush with a sidewall of the encapsulant.

18. The package structure of claim 6, wherein the at least one conductive feature is in direct contact with the underfill layer.

19. The package structure of claim 6, wherein a sidewall of the RDL structure is substantially flush with a sidewall of the encapsulant.

20. The package structure of claim 6, wherein the underfill layer comprises an extension part embedded in one of the dielectric layers of the RDL structure.

\* \* \* \* \*